(12) United States Patent
Peng et al.

(10) Patent No.: US 11,042,073 B2
(45) Date of Patent: Jun. 22, 2021

(54) TUNABLE GRAPHENE METAMATERIALS FOR BEAM STEERING AND TUNABLE FLAT LENSES

(71) Applicant: Massachusetts Institute of Technology, Cambridge, MA (US)

(72) Inventors: Cheng Peng, Revere, MA (US); Dirk Englund, Brookline, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 109 days.

(21) Appl. No.: 16/268,566

(22) Filed: Feb. 6, 2019

(65) Prior Publication Data
US 2019/0243208 A1   Aug. 8, 2019

Related U.S. Application Data

(60) Provisional application No. 62/626,872, filed on Feb. 6, 2018.

(51) Int. Cl.
  *G02F 1/29*   (2006.01)
  *H01L 27/092*   (2006.01)

(52) U.S. Cl.
  CPC ............ *G02F 1/29* (2013.01); *G02F 2202/30* (2013.01); *G02F 2202/36* (2013.01); *G02F 2203/24* (2013.01); *H01L 27/092* (2013.01)

(58) Field of Classification Search
  CPC .... G02F 1/29; G02F 2202/30; G02F 2202/36; G02F 2203/24; H01L 27/092
  See application file for complete search history.

(56) References Cited

U.S. PATENT DOCUMENTS

| | | |
|---|---|---|
| 9,257,509 B2 | 2/2016 | Shepard et al. |
| 2014/0070167 A1 | 3/2014 | Zebarjadi et al. |
| 2017/0037530 A1 | 2/2017 | Narayan |
| 2019/0243208 A1 | 8/2019 | Peng et al. |

OTHER PUBLICATIONS

International Search Report and Written Opinon in International Patent Application No. PCT/US2019/016751 dated Mar. 5, 2020, 16 pages.
Abdollahramezani et al., "Beam manipulating by gate-tunable graphene-based metasurfaces." Optics letters 40.22 (2015): 5383-5386.

(Continued)

*Primary Examiner* — Robert E. Tallman
(74) *Attorney, Agent, or Firm* — Smith Baluch LLP

(57) ABSTRACT

Modulating graphene's optical conductivity with an electrolyte nanopatterning technique reduces or eliminates scattering loss caused by rough edges from etching. This technique uses a resist mask patterned with features as small as 30 nm to shield graphene from ions in an electrolyte. It can provide a carrier density variation of about $10^{14}$ cm$^{-2}$ across a length of just 15 nm. And it can be combined with a technique of growing or transferring graphene on atomically smooth hexagonal boron nitride (hBN) to increase graphene's carrier mobility, e.g., to 10,000 cm$^2$/(V·s) or more. The resulting graphene metamaterials can be used to make voltage-tunable electro-optical devices, such as beam-steering devices, electro-optical switch and modulators, and reconfigurable holograms.

20 Claims, 24 Drawing Sheets

(56) References Cited

OTHER PUBLICATIONS

Anker et al., "Biosensing with plasmonic nanosensors." Nanoscience and Technology: A Collection of Reviews from Nature Journals. 2010. 308-319.

Asner et al., "Carnegie airborne observatory: in-flight fusion of hyperspectral imaging and waveform light detection and ranging for three-dimensional studies of ecosystems." Journal of Applied Remote Sensing 1.1 (2007): 013536. 21 pages.

Aydin et al., "Broadband polarization-independent resonant light absorption using ultrathin plasmonic super absorbers." Nature Communications 2 (2011): 517. 7 pages.

Bao et al., "Atomic-layer graphene as a saturable absorber for ultrafast pulsed lasers." Advanced Functional Materials 19.19 (2009): 3077-3083.

Borgnia et al., "Quasi-Relativistic Doppler Effect and Non-Reciprocal Plasmons in Graphene." arXiv preprint arXiv:1512.09044 (2015). 7 pages.

Brar et al., "Highly confined tunable mid-infrared plasmonics in graphene nanoresonators." Nano Letters 13.6 (2013): 2541-2547.

Carrasco et al., "Gate-controlled mid-infrared light bending with aperiodic graphene nanoribbons array." Nanotechnology 26.13 (2015): 134002. 11 pages.

Reid et al., "Efficient computation of power, force, and torque in BEM scattering calculations." IEEE Transactions on Antennas and Propagation 63.8 (2015): 3588-3598.

Chen et al., "Optical nano-imaging of gate-tunable graphene plasmons." Nature 487.7405 (2012): 77. 30 pages.

Clevenson et al., "Broadband magnetometry and temperature sensing with a light-trapping diamond waveguide." Nature Physics 11.5 (2015): 393. 8 pages.

Constant et al., "All-optical generation of surface plasmons in graphene." Nature Physics 12.2 (2016): 124. 27 pages.

Cox et al., "Plasmon-enhanced nonlinear wave mixing in nanostructured graphene." ACS Photonics 2.2 (2015): 306-312.

Dabidian et al., "Experimental demonstration of phase modulation and motion sensing using graphene-integrated metasurfaces." Nano Letters 16.6 (2016): 3607-3615.

Dorgan et al., "Mobility and saturation velocity in graphene on SiO 2." Applied Physics Letters 97.8 (2010): 082112. 4 pages.

Efetov et al., "Controlling electron-phonon interactions in graphene at ultrahigh carrier densities." Physical Review Letters 105.25 (2010): 256805. 4 pages.

Fang et al., "Active tunable absorption enhancement with graphene nanodisk arrays." Nano letters 14.1 (2013): 299-304.

Fei et al., "Gate-tuning of graphene plasmons revealed by infrared nano-imaging." Nature 487.7405 (2012): 82. 15 pages.

Gan et al., "Chip-integrated ultrafast graphene photodetector with high responsivity." Nature Photonics 7.11 (2013): 883. 6 pages.

Gan et al., "High-contrast electrooptic modulation of a photonic crystal nanocavity by electrical gating of graphene." Nano Letters 13.2 (2013): 691-696.

Gao et al., "High-speed electro-optic modulator integrated with graphene-boron nitride heterostructure and photonic crystal nanocavity." Nano Letters 15.3 (2015): 2001-2005.

Gramotnev et al., "Plasmonics beyond the diffraction limit." Nature Photonics 4.2 (2010): 83. 10 pages.

Gullans et al., "Single-photon nonlinear optics with graphene plasmons." Physical review letters 111.24 (2013): 247401. 5 pages.

Guo et al., "Dual-band-enhanced transmission through a subwavelength aperture by coupled metamaterial resonators." Scientific reports 5 (2015): 8144. 5 pages.

Iranzo et al., "Probing the Ultimate Plasmon Confinement Limits with a Van der Waals heterostructure," Science vol. 360, Issue 6386 (2018), 17 pages.

Jablan et al.,"Multiplasmon absorption in graphene." Physical Review Letters 114.23 (2015): 236801. DOI: 10.1103/PhysRevLett.114.236801. 6 pages.

Jang et al., "Tunable large resonant absorption in a midinfrared graphene Salisbury screen." Physical Review B 90.16 (2014): 165409. 5 pages.

Ju et al., "Graphene plasmonics for tunable terahertz metamaterials." Nature Nanotechnology 6.10 (2011): 630. 6 pages.

Kakenov et al., "Graphene based terahertz phase modulators." 2D Materials 5.3 (2018): 035018. 9 pages.

Kaminer et al., "Quantum Cerenkov Effect from Hot Carriers in Graphene: An Efficient Plasmonic Source." arXiv preprint arXiv:1510.00883 (2015). 22 pages.

Karaveli et al., "Modulation of nitrogen vacancy charge state and fluorescence in nanodiamonds using electrochemical potential." Proceedings of the National Academy of Sciences 113.15 (2016): 3938-3943.

Kim et al., "Electronically tunable perfect absorption in graphene." Nano letters 18.2 (2018): 971-979.

Kim et al., "Synthesis of large-area multilayer hexagonal boron nitride for high material performance." Nature communications 6 (2015): 8662. 11 pages.

Koppens et al., "Graphene plasmonics: a platform for strong light-matter interactions." Nano Letters 11.8 (2011): 3370-3377.

Li et al., "Coherent spin control of a nanocavity-enhanced qubit in diamond." Nature Communications 6 (2015): 6173. 7 pages.

Li et al., "Graphene plasmon enhanced vibrational sensing of surface-adsorbed layers." Nano Letters 14.3 (2014): 1573-1577.

Li et al., "Graphene plasmonic metasurfaces to steer infrared light." Scientific Reports 5 (2015): 12423. 9 pages.

Li et al., "Modulation of mid-infrared light using graphene-metal plasmonic antennas." Applied Physics Letters 102.13 (2013): 131108. 6 pages.

Lorente et al., "Recent advances and applications of hyperspectral imaging for fruit and vegetable quality assessment." Food and Bioprocess Technology 5.4 (2012): 1121-1142.

Low et al., "Graphene plasmonics for terahertz to mid-infrared applications." ACS nano 8.2 (2014): 1086-1101.

Mouradian et al., "Scalable integration of long-lived quantum memories into a photonic circuit." Physical Review X 5.3 (2015): 031009. 8 pages.

Nair et al., "Fine structure constant defines visual transparency of graphene." Science 320.5881 (2008): 1308-1308.

Najafi et al., "On-chip detection of non-classical light by scalable integration of single-photon detectors." Nature Communications 6 (2015): 5873. 8 pages.

Nie et al., "Probing single molecules and single nanoparticles by surface-enhanced Raman scattering." Science 275.5303 (1997): 1102-1106.

Nikitin et al., "Efficient coupling of light to graphene plasmons by compressing surface polaritons with tapered bulk materials." Nano Letters 14.5 (2014): 2896-2901.

Novoselov et al., "The rise of graphene." Nature Materials 6.3 (2007): 183-191.

Ohno et al., "Electrolyte-gated graphene field-effect transistors for detecting pH and protein adsorption." Nano Letters 9.9 (2009): 3318-3322.

Oulton et al., "A hybrid plasmonic waveguide for subwavelength confinement and long-range propagation." Nature Photonics 2.8 (2008): 496. 8 pages.

Park et al., "Large-area monolayer hexagonal boron nitride on Pt foil." ACS Nano 8.8 (2014): 8520-8528.

Rodrigo et al., "Mid-infrared plasmonic biosensing with graphene." Science 349.6244 (2015): 165-168.

Ruppert et al., "Surface acoustic wave mediated coupling of free-space radiation into surface plasmon polaritons on plain metal films." Physical Review B 82.8 (2010): 081416. 4 pages.

Schuller et al., "Plasmonics for extreme light concentration and manipulation." Nature Materials 9.3 (2010): 193. 13 pages.

Sherrott et al., "Experimental Demonstration of >230° Phase Modulation in Gate-Tunable Graphene—Gold Reconfigurable Mid-Infrared Metasurfaces." Nano Letters 17.5 (2017): 3027-3034.

Shi et al., "Optimizing broadband terahertz modulation with hybrid graphene/metasurface structures." Nano Letters 15.1 (2014): 372-377.

(56) References Cited

OTHER PUBLICATIONS

Shiue et al., "High-responsivity graphene-boron nitride photodetector and autocorrelator in a silicon photonic integrated circuit." Nano Letters 15.11 (2015): 7288-7293.

Smith et al., "Metamaterials and negative refractive index." Science 305.5685 (2004): 788-792.

Tamagnone et al., "Graphene Reflectarray Metasurface for Terahertz Beam Steering and Phase Modulation." arXiv preprint arXiv:1806.02202 (2018). 16 pages.

Thongrattanasiri et al., "Complete optical absorption in periodically patterned graphene." Physical Review Letters 108.4 (2012): 047401. 5 pages.

Vakil et al., "Transformation Optics Using Graphene," Science, vol. 332, pp. 1291-1294 (Jun. 10, 2011). 5 pages.

Vicarelli et al., "Graphene field-effect transistors as room-temperature terahertz detectors." Nature Materials 11.10 (2012): 865. 6 pages.

Wan et al., "High-resolution optical spectroscopy using multimode interference in a compact tapered fibre." Nature Communications 6 (2015): 7762. 6 pages.

Yao et al., "Broad electrical tuning of graphene-loaded plasmonic antennas." Nano Letters 13.3 (2013): 1257-1264.

Yatooshi et al., "Terahertz wavefront control by tunable metasurface made of graphene ribbons." Applied Physics Letters 107.5 (2015): 053105. 5 pages.

Yu et al., "Flat optics with designer metasurfaces." Nature Materials 13.2 (2014): 139. 12 pages.

Yu et al., "Light propagation with phase discontinuities: generalized laws of reflection and refraction." Science 334.6054 (2011): 333-337.

Zhan et al., "Band structure of plasmons and optical absorption enhancement in graphene on subwavelength dielectric gratings at infrared frequencies." Physical Review B86.16 (2012): 165416. 5 pages.

Zhu et al., "Experimental observation of plasmons in a graphene monolayer resting on a two-dimensional subwavelength silicon grating." Applied Physics Letters 102.13 (2013): 131101. 5 pages.

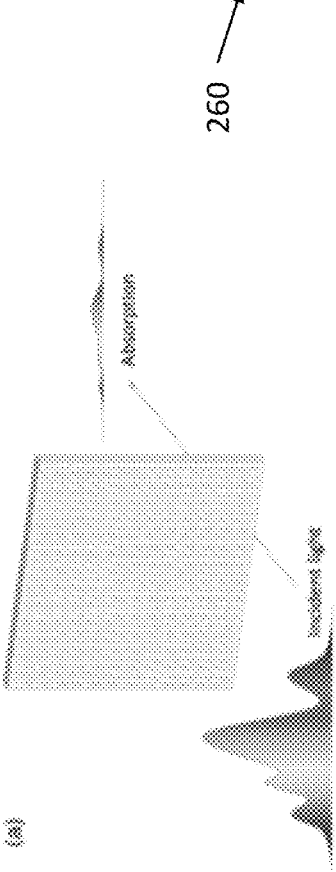
FIG. 1A
FIG. 1B
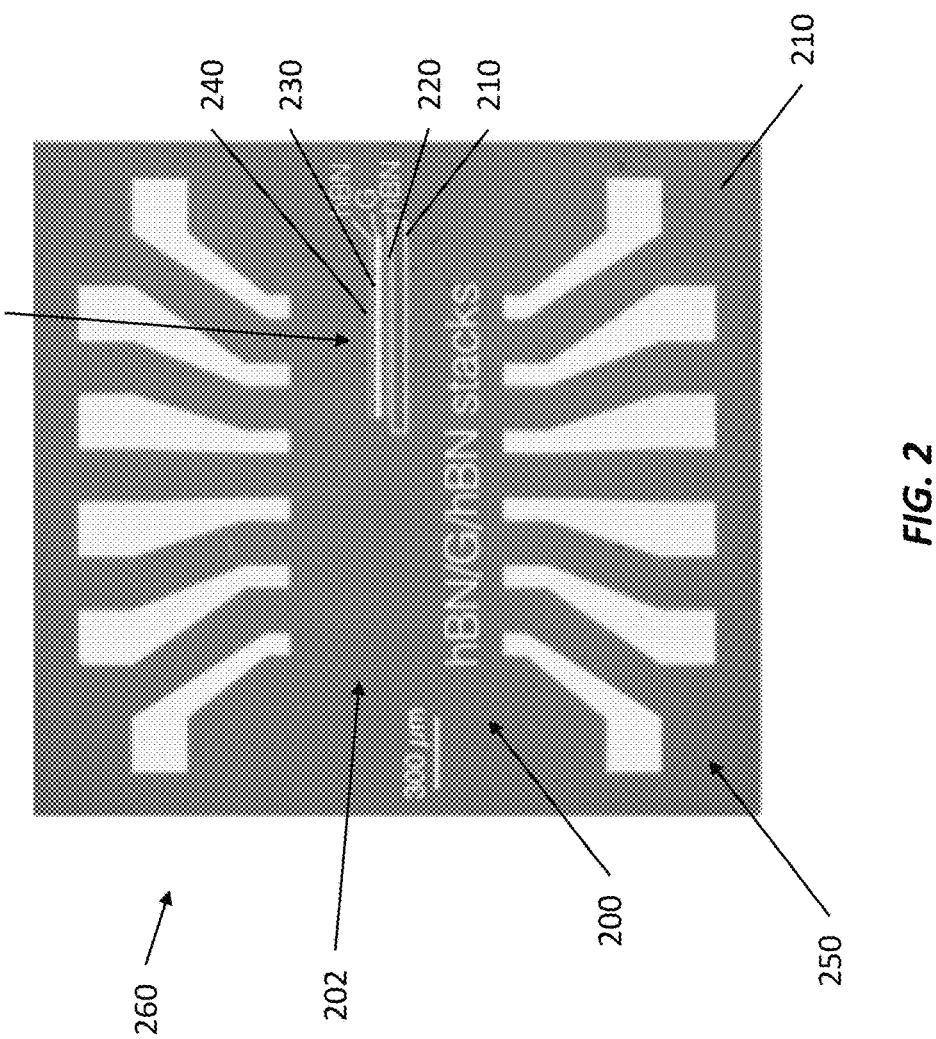
FIG. 2

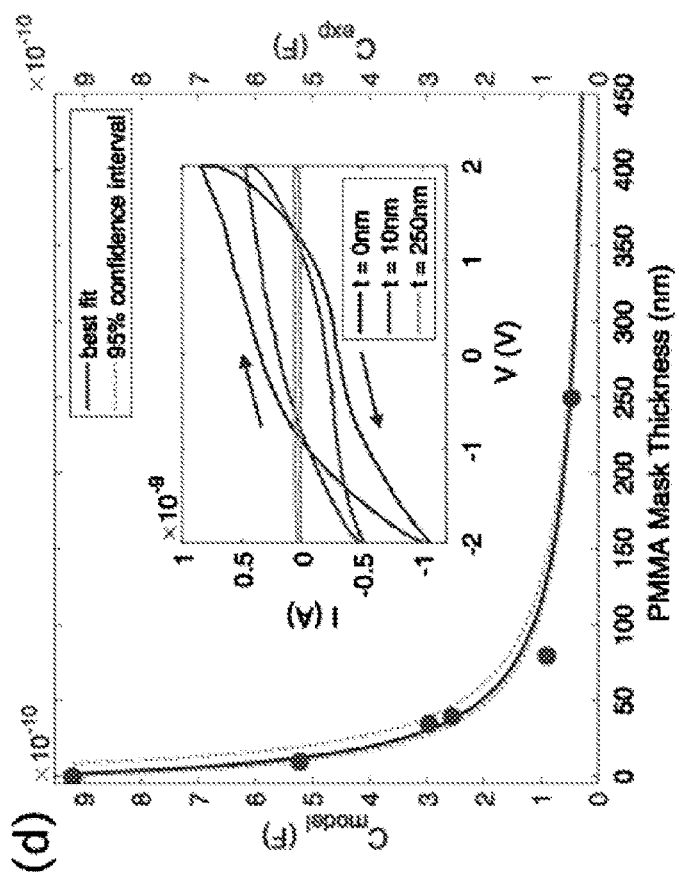
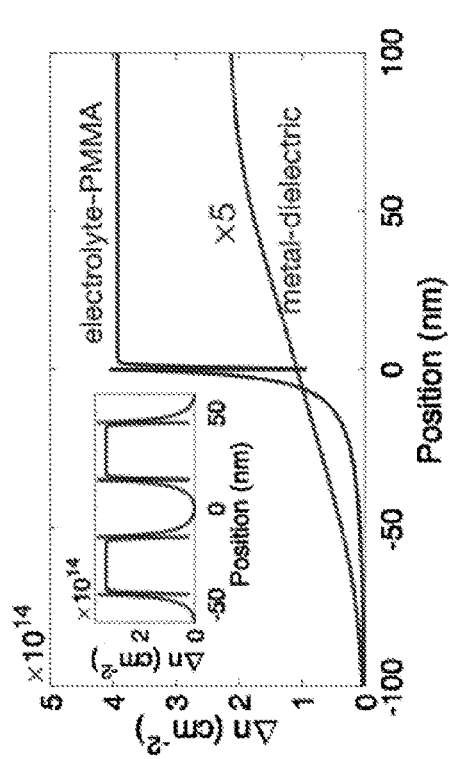
FIG. 3C
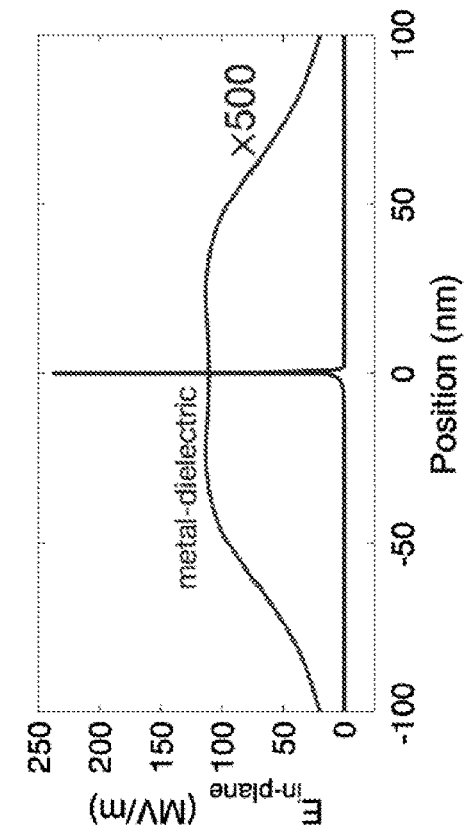
FIG. 3E
FIG. 3D

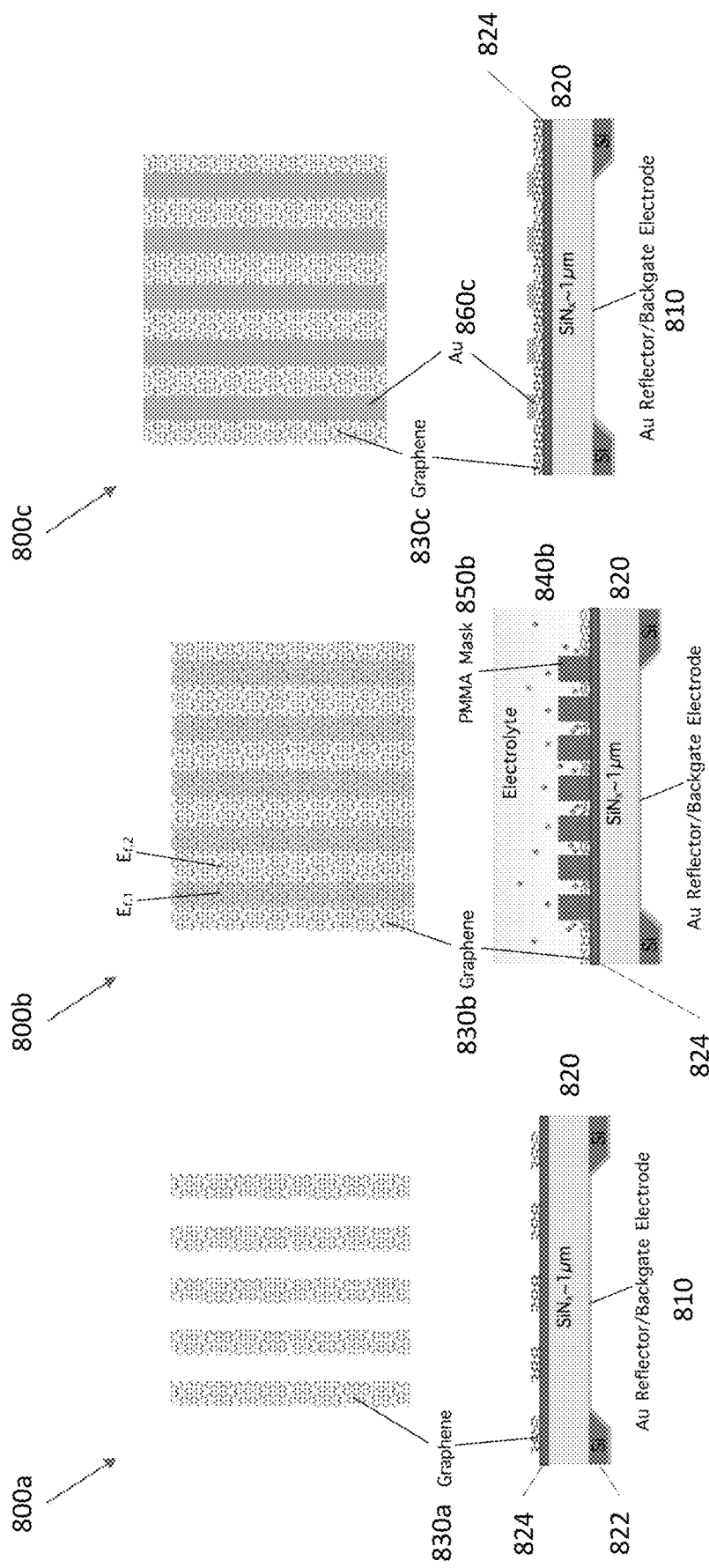

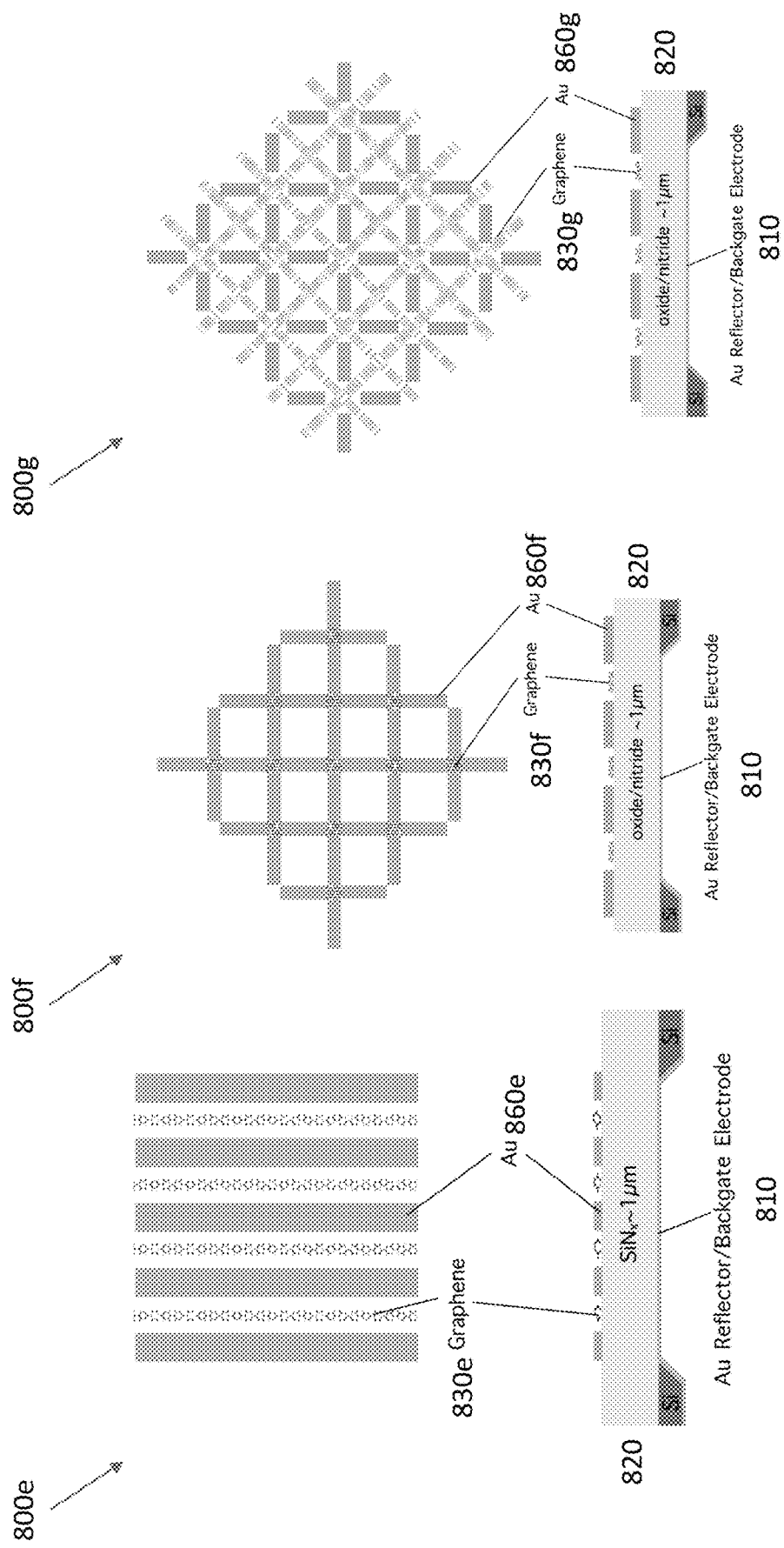

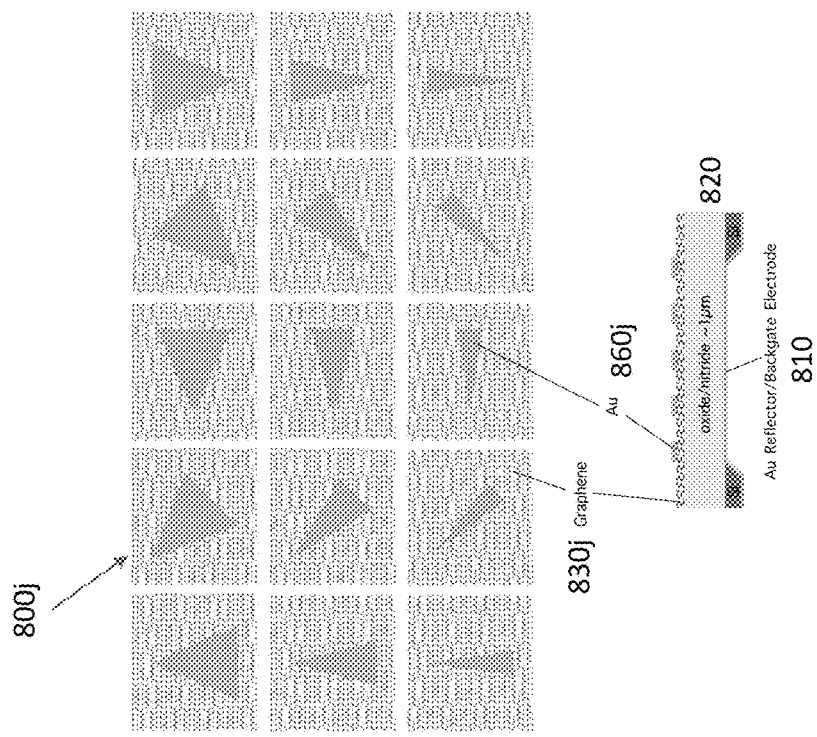
FIG. 8J
FIG. 8I
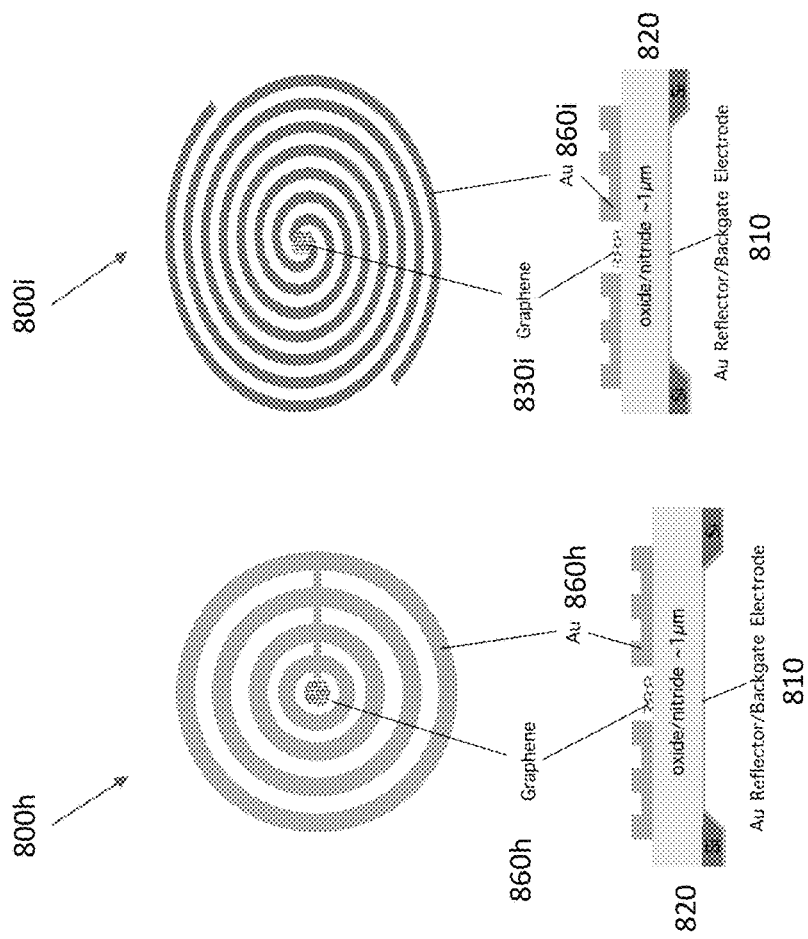
FIG. 8H

B field-free on-chip Mach-Zehnder isolator

TUNABLE GRAPHENE METAMATERIALS FOR BEAM STEERING AND TUNABLE FLAT LENSES

CROSS-REFERENCE TO RELATED APPLICATION(S)

This application claims the priority benefit, under 35 U.S.C § 119(e), of U.S. Application No. 62/626,872, which was filed on Feb. 6, 2018, and is incorporated herein by reference in its entirety.

GOVERNMENT SUPPORT

This invention was made with Government support under Grant No. N00014-14-1-0349 awarded by the Office of Naval Research. The Government has certain rights in the invention.

BACKGROUND

The fields of photonic metamaterials and plasmonics are branches of electromagnetism related to the fundamental study of light-matter interaction that promise exciting applications in photonics and optoelectronics. Metamaterials are materials engineered at the sub-wavelength scale to have optical properties beyond those available in natural materials, such as enhanced light absorption or transmission, light bending, and negative index of refraction. Plasmons are collective oscillations of charge carriers that allow for light manipulation below the diffraction limit via extreme confinement of electromagnetic fields. These properties of metamaterials and plasmonics have opened up a wide range of promising applications, including surface-enhanced Raman scattering, plasmonic waveguiding, biochemical sensing, and plasmon-enhanced nonlinear optics.

Graphene, a two-dimensional carbon-atom lattice, possesses unique mechanical, electrical and thermal characteristics. In optics, for example, graphene's exceptionally strong and broadband light-matter interaction, extreme Fermi level tunability by electrical gating or chemical doping, high carrier mobility, and high optical nonlinearity have led to many demonstrations of optoelectronic devices, such as high-speed photodetectors for visible to terahertz, high-speed optical modulators with large contrast, and saturable absorbers for mode-locked lasers. Additionally, the fact that graphene is a zero-bandgap semimetal enables surface plasmon polaritons (SPP) in graphene. Compared to conventional metals, graphene features extremely low loss and tunable plasmons that can be confined into an extremely small mode volume $\sim(\lambda/100)^3$ and modulated at extremely high frequencies. As an example, this could lead to optical nonlinearities at a few-photon level.

Moreover, certain special properties of graphene allow the exploration of novel fundamental phenomena that usually do not occur in other materials. For instance, the extremely high carrier velocity in graphene ($v=10^6$ m/s=c/300) may make the quantum Cerenkov effect possible, and the high carrier drift velocity ($u=3\times10^5$ m/s) measured in graphene has led to predictions of the quasi-relativistic Doppler effect and non-reciprocal plasmons in graphene. The combination of a wide palette of promising applications and a platform for studying fundamental physics makes graphene an excellent candidate for plasmonics.

Although progress in nanoscale fabrication and electromagnetic simulation has enabled numerous fundamental studies on the properties of metamaterials and plasmonics and realized many device prototypes, the quality of the prepared samples has held back device performance in terms of dissipative loss and working wavelength, preventing further study of metamaterial or plasmon-enabled novel phenomena which require high-quality and low-loss samples. Reducing loss in plasmonic and metamaterial systems to improve the quality factor has become the most pressing concern for the field, and the question of whether device performance can be improved to reach the standard of real-world applicability has to be answered. In particular, in graphene, plasmonic studies have been limited to exfoliated samples, which has a higher carrier mobility than graphene grown with chemical vapor deposition (CVD). However, the small sample size produced by the exfoliation method (10 μm×10 μm) limits the range of studies that can be performed and applications that can be realized. The ability to maintain high device quality while making use of CVD-grown graphene is the bottleneck of graphene plasmonics at present.

SUMMARY

The extreme and tunable optoelectronic properties of graphene—a single layer of carbon atoms—promise new generations of optical devices with unprecedented capabilities, including tunable, ultrathin zoom-lenses without moving parts for mobile applications, ultra-flat laser radar transmitters for precision navigation of autonomous vehicles, and single-photon-level optical nonlinearities for quantum information processing and sensing. However, reaching these applications involves high-quality large-scale encapsulated graphene samples, methods for graphene nanometer-scale doping with high carrier densities, and device designs closely coupled to experimentally measured graphene properties. Embodiments of the present technology address these problems through high-quality material assembly, device fabrication, and iterative device measurement, modeling, and optimization. These embodiments are disclosed herein with reference to four technologies: (1) high-quality programmable (e.g., voltage-tunable) graphene metamaterials for plasmonics; (2) nonreciprocal graphene plasmons and optical isolators; (3) flat optics with graphene metamaterials; and (4) extreme mode-confinement of graphene plasmons and few-photon nonlinear optics.

Embodiments of these technologies include devices made with a comprehensive and iterative approach that enables dramatically improving graphene photonic device properties through closely coupled efforts in systems design, high-quality graphene sample growth and assembly, nanofabrication and sample processing, and measurement-based device modeling. In programmable graphene metamaterials for plasmonics, graphene plasmons with higher quality factors are achieved by adopting a material assembly geometry of encapsulation of chemical vapor deposition (CVD)-grown graphene in CVD-grown hexagonal boron-nitride (hBN) and applying an optical conductivity variation approach for excitation of graphene plasmons without nanopatterning of the graphene, leveraging new material growth methods and a nanoscale strong electrostatic doping technique.

Nonreciprocal graphene plasmons and optical isolators, flat optics with graphene metamaterials, and extreme mode-confinement of graphene plasmons and few-photon nonlinear optics take advantage of several phenomena of graphene plasmonics, including nonreciprocal graphene plasmons, the generalized law of refraction and reflection of metamaterials, and the low-power nonlinear optics as a result of the extreme mode confinement by graphene plasmons. They also take advantage of novel simulation methods and an iterative measurement-based device modeling approach. These techniques lead to further embodiments of the present technology, including nanophotonic ultra-thin zoom-lenses, compact and flat LIDAR transmitters, and single photon optical switches.

Embodiments of the present technology address the grand challenge faced by the field of graphene plasmonics today: limited plasmon quality factor for large-scale samples due to sample assembly and fabrication. Solutions to this problem, combined with closely coupled efforts in iterative device and system designs, open up numerous possibilities for nanophotonic technology in optical communication, optical computing, sensing, imaging, and precision navigation, among other applications. The present technology may impact other fields as well. Improvements in material growth and assembly, nanofabrication, nanoscale doping control technique, and nanoantenna designs may enable breakthroughs in other emerging 2D material applications, such as light-emitting devices, single photon emitters, and optical detectors based on transition metal dichalcogenides (TMDs).

The present technology may take the form of apparatus (e.g., a tunable lens or beam-steering device) with a first electrode on one side of a substrate and an array of unit cells on the other side of the substrate. Each unit cell in the array of unit cells comprises a layer of hexagonal boron-nitride (hBN) disposed on the substrate, a graphene layer disposed on the layer of hBN and having a carrier mobility substantially equal to or greater than 10,000 cm$^2$/(V·s), and a second electrode disposed in electrical communication with the graphene layer. In operation, the first and second electrodes apply a voltage across the graphene layer that shifts a Fermi level of the graphene layer, thereby changing an amplitude and/or phase of at least a portion of an incident beam of light. This causes the array of unit cells to spatially modulate the incident beam of light.

The array of unit cells may form a one-dimensional (1D) array of unit cells configured to steer the incident beam of light in an arbitrary direction. Or the array of unit cells may include a two-dimensional (2D) array of unit cells configured to change a divergence of the incident beam of light. A first group of unit cells in the 2D array of unit cells may form a first ring and a second group of unit cells in the 2D array of unit cells form a second ring concentric with the first ring.

The graphene layer in at least one unit cell in the array of unit cells may be patterned to from an array of graphene nanostructures. In this instance, the unit cell may include an array of metal strips, each of which is disposed next to a corresponding graphene nanostructure in the array of graphene nanostructures. The unit cell can also include an array of metal nanoantennas disposed on the layer of graphene and having hotspots at graphene nanostructures in the array of graphene nanostructures to excite and couple to localized graphene plasmons. And the unit cell may include hBN disposed between the graphene nanostructures in the array of graphene nanostructures.

The graphene layer may include alternating regions of a first carrier concentration and a second carrier concentration different from the first carrier concentration. These alternating regions can be at a pitch substantially equal to or greater than 15 nm. A difference between the first carrier concentration and the second carrier concentration may be substantially equal to or less than $10^{14}$ cm$^{-2}$.

A given unit cell in the array of unit cells can include another layer of hBN disposed on the graphene layer, a periodic array of metallic slits disposed on the graphene layer, a two-arm Archimedean spiral antenna, and/or a nanoantenna comprising concentric metallic rings electrically connected to each other. For a nanoantenna with a two-arm Archimedean spiral antenna or concentric metallic rings, the graphene layer may be formed as or include a graphene nanodisk disposed at a center of the Archimedean spiral antenna or nanoantenna.

The substrate may be a layer in a complementary metal-oxide-semiconductor (CMOS) stack. If so, then at least a portion of the second electrode can extend into the CMOS stack. And the first electrode may be at least part of a metal layer in the CMOS stack.

Another apparatus embodying the present technology includes a substrate, a graphene layer (e.g., with a carrier mobility of at least about 10,000 cm$^2$/(V·s)) disposed on the substrate, an electrolyte disposed on the graphene layer, a first electrode in electrical communication with the graphene layer, a second electrode in electrical communication with the electrolyte, and a patterned dielectric layer between the graphene layer and the electrolyte. In operation, the pair of electrodes applies a bias voltage across the graphene layer and the electrolyte that causes ions in the electrolyte to migrate toward the graphene layer. The patterned dielectric layer screens at least a portion of the graphene layer from ions in the electrolyte, thereby creating a spatially varying carrier concentration in the graphene layer. This spatially varying carrier concentration spatially modulates an optical conductivity of the graphene layer. The patterned dielectric layer can be patterned in a periodic array such that the spatially varying carrier concentration varies periodically with the periodic array.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. Terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1A shows universal 2.3% optical absorption by a uniform sheet of monolayer graphene.

FIG. 1B shows enhanced absorption in certain spectral ranges by a nanostructured sheet of monolayer graphene subject to an applied voltage.

FIG. 2 shows example devices fabricated with stacks of monolayer hBN and graphene grown by chemical vapor deposition (CVD) and transferred by the van der Waals assembly technique onto a substrate.

FIG. 3C is a plot of simulated charge carrier density for a single metal-dielectric split gating junction and an electrolyte-PMMA-mask gating junction like those in the device of FIG. 3A. The inset shows simulated charge carrier density profile for the electrolyte-PMMA gating scheme with a periodic PMMA mask with width l=30 nm and thickness d=20 nm.

FIG. 3D is a plot of simulated in-plane electric field intensity $E_{in-plane}$ for a single metal-dielectric split gating junction and an electrolyte-PMMA-mask gating junction like those in the device of FIG. 3A.

FIG. 3E is a plot of the capacitance of an example PMMA-mask/electrolyte system like the one shown in FIG. 3A.

FIGS. 8A-8L show different unit cells for tunable flat optics made with graphene metamaterials.

DETAILED DESCRIPTION

Figure 3A:
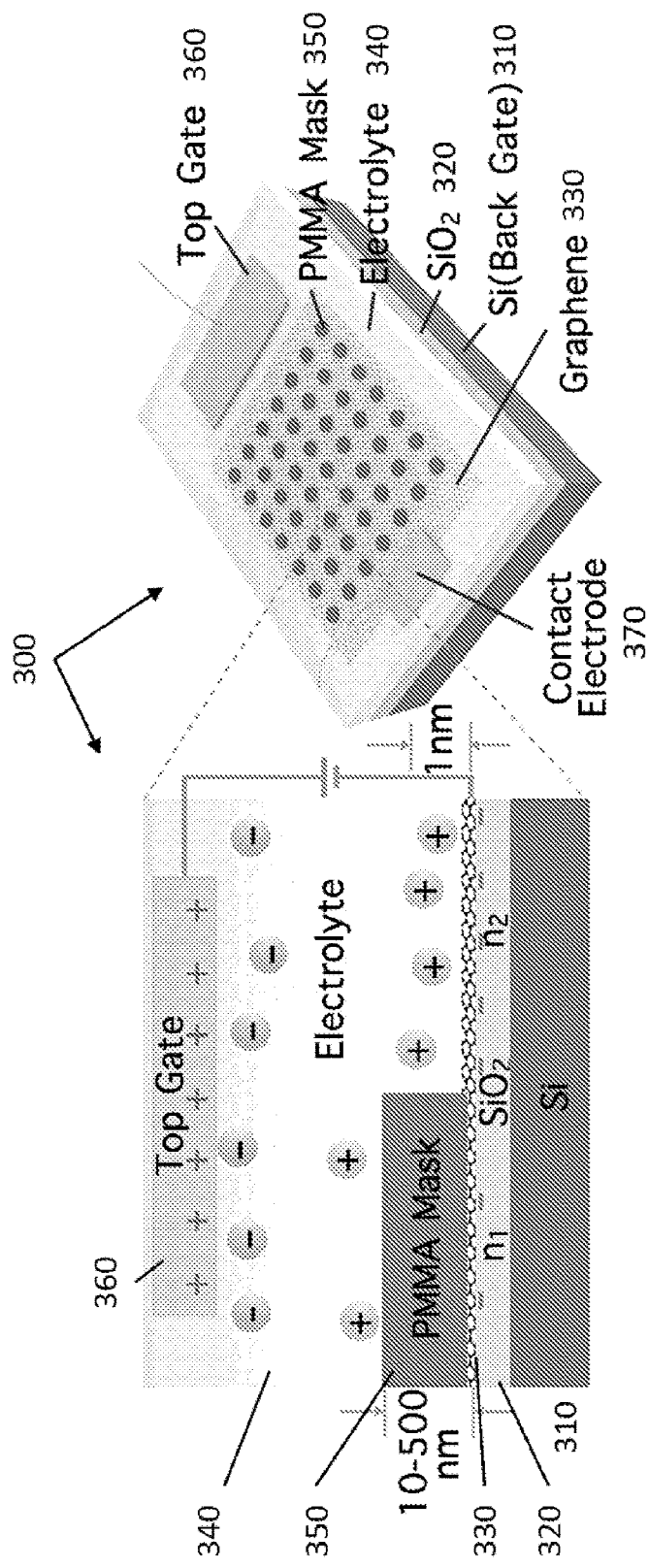
FIG. 3A is a diagram of a graphene device with nanoscale electrolyte gates.

The present technology includes several approaches for metamaterials and plasmonics in graphene that provide and exploit high-quality graphene grown with chemical vapor deposition (CVD). Examples of these approaches involve encapsulation of CVD-grown graphene in CVD-grown hexagonal boron-nitride (hBN) (growing or transferring the graphene on a layer of hBN yields a graphene layer with fewer impurities and fewer nanoscale strain variations, and hence a higher carrier mobility (e.g., a carrier mobility of 10,000 cm$^2$/(V·s) or higher), a nanoscale 2D material doping technique that enables plasmon excitation without patterning the graphene (the patterning process usually degrades graphene's quality and mobility by one to two orders of magnitude due to harsh environment during etching and edge scattering in the patterned sample), and/or an in-plane graphene/hBN heterostructure geometry with well-defined graphene edges that reduces loss associated with scattering from rough edges in patterned graphene nanostructures. The higher quality factors for graphene plasmons open up numerous possibilities for both the fundamental study of plasmonic physics in graphene and exciting applications that were not realizable before.

Programmable Graphene Metamaterials with High Quality Factors

Poor plasmon quality factors are the current bottleneck for experimental studies of plasmonic physics in graphene as well as for real-world applicable devices based on graphene plasmonics. One example of the mismatch between theoretical predictions and experimental observations of the quality of graphene plasmons is the optical absorption of periodically patterned graphene nanostructures, such as nanodisks or nanoribbons. As opposed to the universal 2.3% of optical absorption by a single layer of graphene, complete optical absorption has been predicted for periodically arranged single-layer graphene nanodisk arrays, as a result of localized plasmonic modes excitation in graphene nanostructures. The spectrally selective absorption can furthermore be tuned across a wide spectral range by applying an electric voltage to the graphene sheet to alter its Fermi level.

FIGS. 1A and 1B illustrate this voltage-tunable enhanced absorption. FIG. 1A shows the universal 2.3% absorption of a non-structured graphene sheet. FIG. 1B shows perfect absorption by a nanostructured graphene sheet in different spectral regions when a variable voltage is applied to the nanostructured graphene sheet. The spectral range of the nanostructured graphene sheet's enhanced absorption can be tuned by tuning the applied voltage. This varies the Fermi level of the nanostructured graphene sheet. The absorption can occur over a wide range of wavelengths, from the visible to the infrared.

While so far efforts have been made in experimentally demonstrating this tunable spectral absorption, only <30% optical absorption has been observed to date. Without being bound by any particular theory, this mismatch may arise from the low carrier mobility of graphene after the etching step in the nanostructure fabrication process and the edge scattering from patterned graphene nanostructures that is not considered in numerical electromagnetic simulations.

The graphene metamaterials with high quality factors disclosed here address these two causes of low-quality graphene plasmons using three techniques: (1) growing or transferring graphene on hBN to increase carrier mobility, (2) exciting plasmonic modes by creating periodic optical conductivity variation patterns in a continuous sheet of graphene, and (3) growing an in-plane, lattice-matched graphene/hBN heterostructure with well-defined graphene edges to reduce scattering loss from rough edges. Transferring or growing graphene by CVD on hBN or encapsulating CVD-grown graphene by CVD-grown hBN creates a dielectric environment where graphene maintains a high carrier mobility of graphene of 10,000 $cm^2/(V·s)$ (for monolayer hBN) to even 24,000 $cm^2/(V·s)$ (for multilayer hBN). This is a one- to two-order of magnitude increase over carrier mobilities of previously demonstrated CVD graphene plasmonic devices, which typically have a mobility of about 100 $cm^2/(V·s)$ to about 1000 $cm^2/(V·s)$. This increased carrier mobility can boost the optical absorption of some graphene structures from 30% to 100%.

Transferring/Growing Graphene on hBN for Higher Carrier Mobility

Strain in graphene causes disorder, which in turn causes random pseudomagnetic field fluctuations at the nanometer scale that limits the carrier mobility and carrier scattering lifetime in the graphene. All of these affect the quality factor of plasmons. Fortunately, the disorder (and hence the strain) can be reduced by transferring or growing graphene on hBN, which has an atomically flat surface. hBN can be grown in monolayer single-crystalline flakes with sizes up to 50 μm and continuous polycrystalline films that are centimeters in size have been synthesized. To further reduce strain and increase carrier mobility, the CVD graphene on CVD hBN can be transferred using a dry transfer method to avoid the strain caused by trapped water bubbles between graphene and hBN surfaces typically seen in wet transfer methods.

Synthesis of large-area graphene and other 2D materials with high carrier mobility can be realized in the growth of multilayer hBN as well as uniform thickness single-layer hBN that is centimeters by centimeters in size. This is a dramatic increase in size from exfoliated samples (e.g., 10 μm×10 μm) of graphene, providing high-quality large-area graphene samples for experiments in the mid-infrared and terahertz, where most applications of graphene plasmonics lie. Compared to CVD graphene on normal substrates, such as $SiO_2$ or Si, encapsulating the graphene in hBN reduces contamination of the graphene by charge impurities, and the uniform thickness of hBN provides a flat substrate for graphene that largely prevents the wrinkles and tearing of graphene typically seen in CVD samples.

FIG. 2 shows an example of a CVD hBN-encapsulated graphene device 200 fabricated with graphene and hBN grown by chemical vapor deposition (CVD) and transferred by the van der Waals assembly technique onto a dielectric substrate 210, such as $SiO_2$, $SiN_x$, $CaF_2$, or intrinsic Si. The device 200 forms a metasurface with several unit cells 202 arranged in a one-dimensional array on the substrate 210 and connected to electrodes 250 and 260. A layer of metal or doped semiconductor (not shown) is deposited to the back side of the substrate 210 to serve as a gate electrode. The unit cells 202 can be arranged in other patterns, including two-dimensional arrays, as explained below. Applying a voltage to a unit cell 202 with the corresponding electrodes changes the Fermi level of the graphene in the unit cell 202, thereby changing the unit cell's absorption (e.g., from low absorption at a particular wavelength to high absorption at that wavelength).

The inset of FIG. 2 shows that each unit cell 202 includes a graphene layer 230 sandwiched between a lower hBN layer 220 and an upper hBN layer 240. Because the graphene layer 230 is grown or transferred on the lower hBN layer 220, it has a carrier mobility of 10,000 $cm^2/(V·s)$ (for monolayer hBN) to even 24,000 $cm^2/(V·s)$ (for multilayer hBN). These hBN/G/hBN stacks 202 can be used to study the confinement of acoustic plasmons in graphene 230. The observation of atomically thin plasmon field confinement in the few-layer hBN on top of graphene has been shown to be the tightest plasmon confinement ever observed, demonstrating the ultimate limit of plasmon field confinement in any material system.

Spatially Varying Optical Conductivity Patterns in Graphene

High quality factors for graphene plasmons in graphene metasurfaces can also be maintained by creating periodic optical conductivity variation patterns in a continuous sheet of graphene. This periodic conductivity variation pattern can be realized at the nanoscale with a high conductivity contrast without the edge scattering that occurs in patterned graphene nanostructures. It allows for electrostatic doping of graphene at record high Fermi levels (e.g., >1 eV) with an unprecedentedly high spatial resolution (e.g., sub-10 nm). These are both orders of magnitude improvement on the state-of-the-art doping techniques and could push the plasmonic resonance wavelength of graphene into the near-infrared or even visible range.

FIGS. 3A-3D illustrate aspects of a device 300 with a continuous sheet of graphene 330 that has a spatial carrier density variation pattern. FIG. 3A shows the device 300 itself, with the graphene layer 330 between a layer 340 of solid polymer electrolyte, such as $PEO/LiClO_4$, and a silicon dioxide layer 320 on a silicon substrate 310. If desired, the graphene layer 330 can be grown or transferred by CVD on an hBN monolayer (not shown) on the silicon dioxide layer 330. As explained above, growing or transferring the graphene layer 330 on an hBN monolayer can yield a graphene layer that has fewer impurities, a larger wrinkle-free area, and a carrier mobility of 10,000 $cm^2/(V·s)$ or higher.

A patterned dielectric 350, such as a layer of electron-beam (e-beam) over-exposed, cross-linked poly(methyl methacrylate) (PMMA), covers part of the graphene layer 330 and is covered by the electrolyte layer 340. The patterned dielectric 350 has a thickness of about 10 nm to about 500 nm and can be patterned into nanostructures of different shapes, including circles, ribbons, ellipses, or even rectangular waveguide and circular ring resonator shapes. These nanostructures can be arranged in one or two dimensions with feature sizes all the way from about 15 nm to about micrometer-sized or larger. In FIG. 3A, for instance, the patterned dielectric 350 is patterned in an array of discs on a square lattice. Other patterned dielectrics may be patterned into one-dimensional arrays of nanoribbons, two-dimensional arrays on different lattices (e.g., rectangular or hexagonal lattices), or aperiodic, random, or sparse arrays.

Figure 3B:
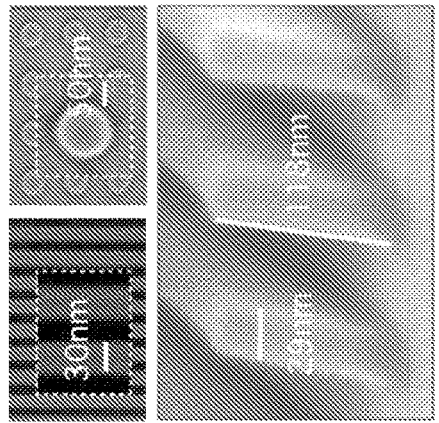
FIG. 3B shows SEMs of example fabricated PMMA masks on graphene with nanoscale dimensions.

FIG. 3B shows scanning-electron-micrographs (SEMs) of two examples of PMMA mask on graphene with nanometer feature size and different geometries, including disks (upper right image) and ribbons (upper left image and lower image). The disks have a radius of about 50 nm, and the ribbons are about 29 nm wide and 118 nm tall with a period of about 60 nm.

The device 300 includes a contact electrode 370 that touches the graphene layer 330 and is isolated from the silicon substrate 310 back gate by the silicon dioxide layer 320. It also includes a top gate electrode 360 that is on or embedded in the electrolyte layer 340 but is isolated from the graphene layer 330. Electrolytic gating of graphene can yield a carrier density of $n=10^{14}$ $cm^{-2}$, which is the highest recorded to date.

Applying a voltage across the graphene layer 330 and electrolyte layer 340 causes charge carriers in the electrolyte layer 340 to migrate toward the graphene layer 330. These charge carriers accumulate at the interface between the electrolyte layer 340 and the graphene layer 330 (e.g., within about 1 nm of the graphene layer 330). In regions of the device 300 where the graphene layer 330 touches the electrolyte layer 340, the carrier density at the graphene/electrolyte interface can reach $n=10^{14}$ $cm^{2-2}$. In regions of the device 300 where the patterned dielectric (PMMA mask) 350 is between the graphene layer 330 and the electrolyte layer 340, the patterned dielectric 350 screens ions in electrolytes. This creates a spatially varying carrier concentration in the graphene layer 330 as carriers within the graphene redistribute themselves in response to the carrier movement in the electrolyte 340 under the applied voltage.

Put differently, the patterned dielectric 350 prevents the mask-protected areas of the graphene layer 330 from being modulated by the electrolyte gate. This effectively create lithographically-defined local electrolyte gates with geometries and feature sizes determined by the pattern etched into the patterned dielectric layer. Because the patterned dielectric layer can be etched lithographically, this means that the gates can be patterned with feature sizes down to several nanometers.

FIG. 3C shows finite-element simulations of both an electrolyte-PMMA junction like those in FIG. 3A and a conventional metal-dielectric split gate junction. FIG. 3C shows a much sharper carrier density transition for an electrolyte-PMMA junction compared to a conventional metal-dielectric split gate junction, with a junction sharpness of as low as 10 nm and a local carrier concentration contrast of more than $10^{14}$ $cm^{-2}$. The inset of FIG. 3C shows the simulated charge carrier density profile for an electrolyte-PMMA gating scheme with a periodic PMMA mask with width l=30 nm and thickness d=100 nm. FIG. 3D shows an in-plane electric field intensity of 600 MV/m at the vicinity close to the graphene boundary.

FIG. 3E is a plot of the capacitance of an example PMMA-mask/electrolyte system extracted from capacitance-voltage (CV) measurements (dots) and fitted to a model (curve) as a function of the mask thickness. The area between the two dotted lines indicates the 95% confidence interval of the fitting. The inset of FIG. 3E shows measured CV curves for samples with different PMMA mask thicknesses. The arrows indicate the voltage sweeping directions.

Figure 3G:
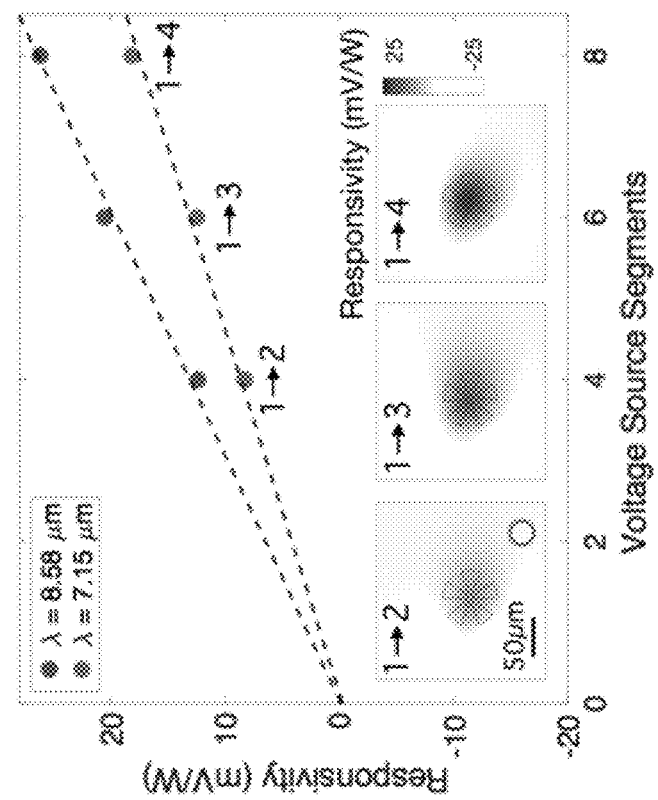
FIG. 3G is a plot of the photovoltage responsivity measured at the center of the thermopile as a function of the number of voltage source segments at λ=8.58 μm and λ=7.15 μm for the graphene thermopile of FIG. 3F.
Figure 3F:
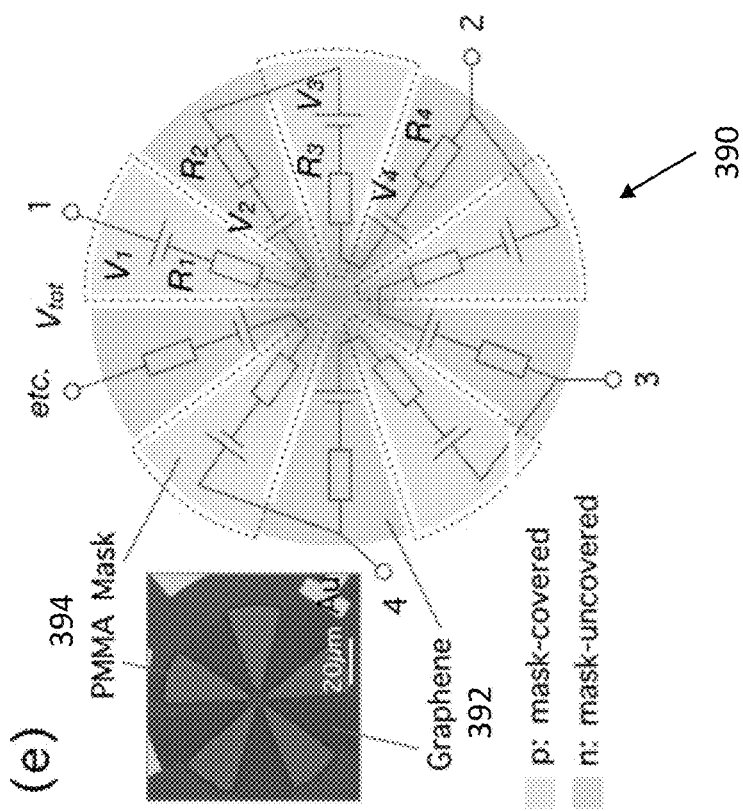
FIG. 3F shows a schematic (right) and a photograph (left) of a compact graphene thermopile coated with a patterned PMMA mask.

FIG. 3F shows a schematic (right) and a photograph (left) of a compact graphene thermopile 390 with wedges of resist (PMMA) 394. When viewed from the top (as in FIG. 3F), the resist 394 creates a pinwheel-like pattern of exposed and coated wedges of graphene. The wedges can be represented electrically as alternating impedance and voltage sources ($V_1$, $R_1$, $V_2$, $R_2$, and so on) connected in series.

FIG. 3G shows the graphene thermopile's photovoltage responsivity measured at the center of the thermopile 390 as a function of the number of voltage source segments included in the circuit at $\lambda=8.58$ μm and $\lambda=7.15$ μm. The inserts in FIG. 3G show the photovoltage responsivity spatial mappings of the thermopile 390 measured at $\lambda=8.58$ μm, with 4, 6 and 8 voltage source segments included in the circuit, respectively. The dashed circles indicate the size of the thermopile 390. The solid circle at lower right in the left inset indicates the full-width half-maximum (FWHM) of the laser spot (about 30 μm) used to make the measurements.

Figures 4A, 4B, 4C, 4D, 4E:
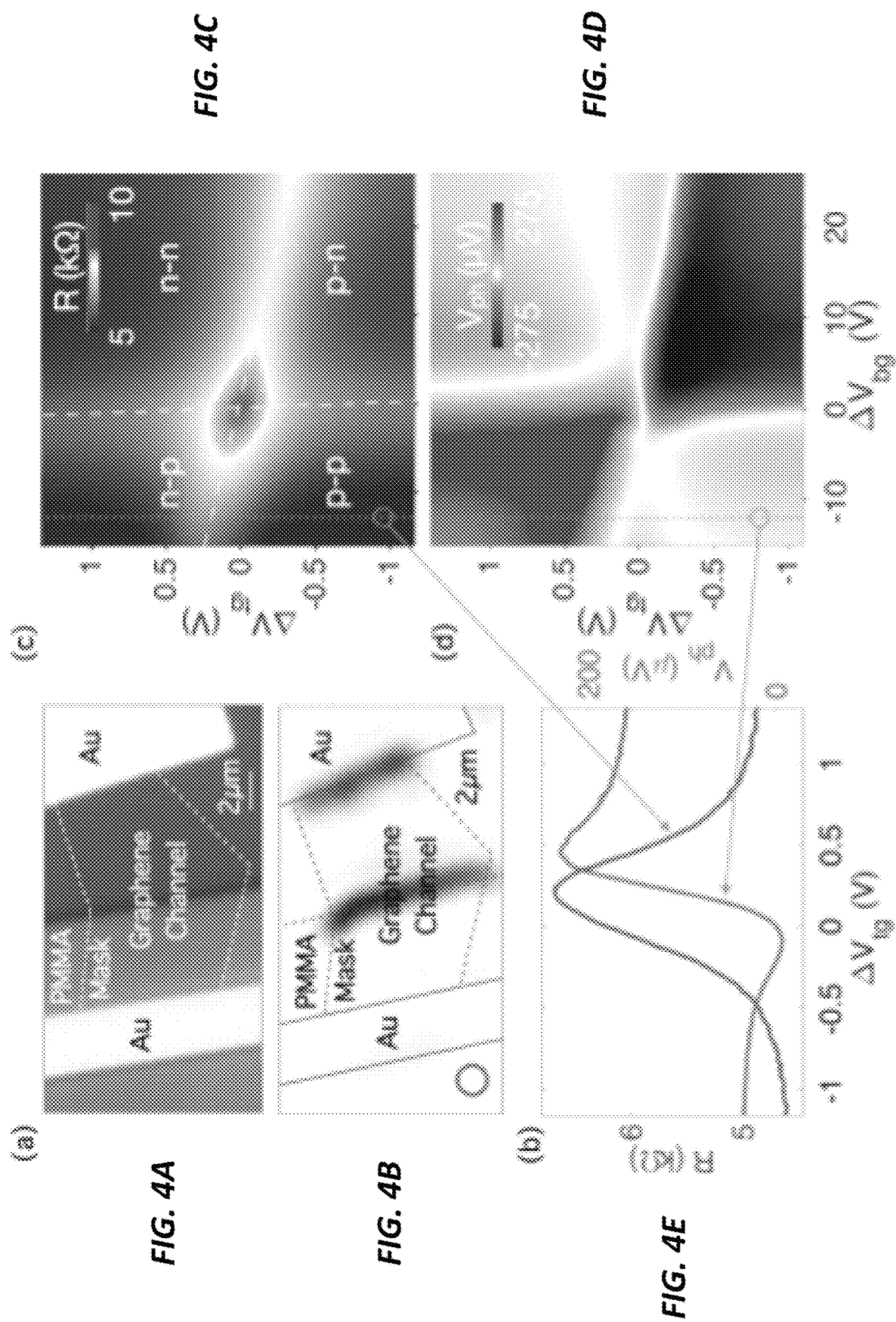
FIG. 4A is an optical image of a graphene p-n junction device, with the p-n junction defined by a PMMA mask as in the device shown in FIG. 3A.
FIG. 4B shows a photovoltage spatial mapping of the graphene p-n junction device of FIG. 4A, with the circle (lower right) indicating the spot size of the near-infrared (λ=1.55 μm) confocal microscope used to make the mapping.
FIG. 4C is a plot of resistance of the graphene p-n junction device of FIG. 4A as a function of the top gate voltage $V_{TG}$ and the back gate voltage $V_{BG}$.
FIG. 4D is a plot of photovoltage of the graphene p-n junction device of FIG. 4A as a function of the top gate voltage $V_{TG}$ and the back gate voltage $V_{BG}$.
FIG. 4E is a plot of the resistance (left axis) and photovoltage (right axis) of the graphene p-n junction device of FIG. 4A as a function of $V_{TG}$ measured at $\Delta V_{BG}$=−12 V.

FIGS. 4A-4E show tests of full-range carrier density control of a graphene p-n junction created by depositing a patterned PMMA layer on half of a graphene channel and covering the entire channel and the patterned PMMA layer with an electrolyte. FIG. 4A is an optical photograph of the graphene p-n junction, which is tuned by applying a voltage to gold (Au) electrodes. The white dashed lines indicate the shape of the graphene channel and the green region is the cross-linked PMMA mask. The entire device is then covered with solid polymer electrolyte $PEO/LiClO_4$ (not shown in the picture). FIG. 4B shows a spatial photovoltage map of the graphene p-n junction created with near-infrared confocal microscope with a spot size indicated by the circle at lower left. The darker regions illustrate strong photovoltage signals generated at the p-n junction and the graphene/metal junction. The polarity of the photovoltage signal at the p-n junction is opposite the polarity of the photovoltage signal at the graphene/metal junction.

FIGS. 4C and 4D illustrate the graphene p-n junction's voltage-tunable resistance and the voltage-tunable photoresponse generated at the interface of separately doped graphene regions, respectively. FIG. 4E is a plot of the resistance (left axis) and photovoltage (right axis) as a function of Vtg at Vbg=−12V. The data in FIGS. 4C-4E confirm the selective gating ability and full voltage-tunability of the graphene p-n junction.

Figures 5A, 5B:
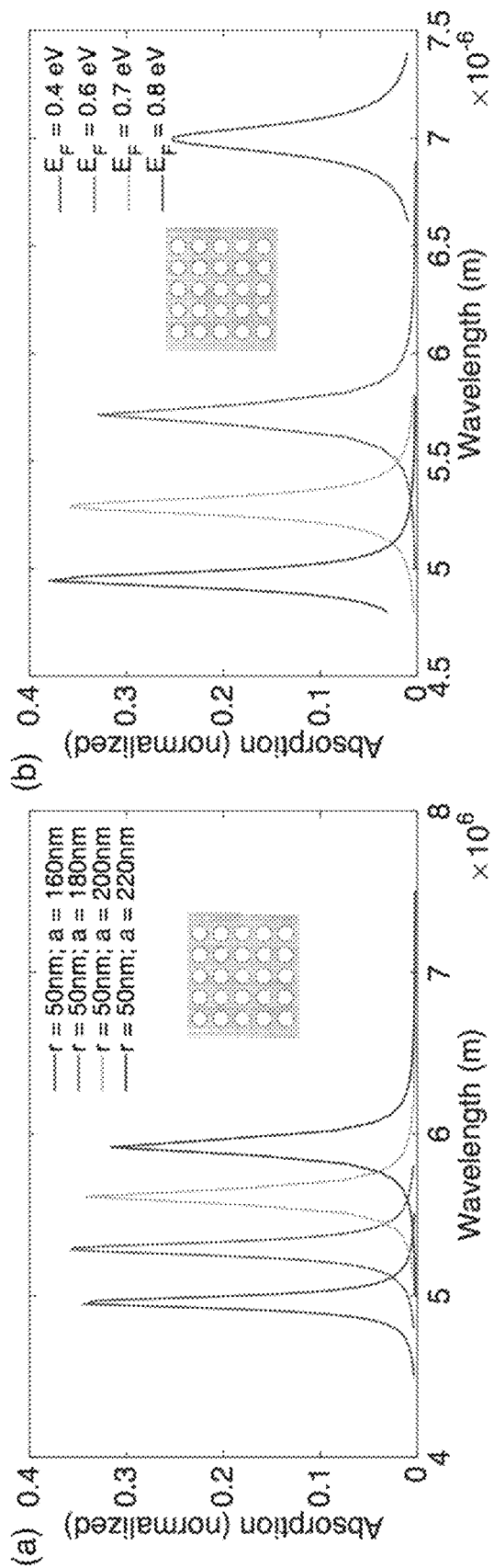
FIG. 5A shows optical absorption spectra for nanoscale electrolytically gated graphene absorbers with different dimensions.
FIG. 5B shows absorption spectra of a nanoscale electrolytically gated graphene absorber via electrostatic gating of graphene with Fermi levels from 0.4 eV to 0.8 eV.

FIGS. 5A and 5B show simulated optical absorption spectra for an example graphene metamaterial with conductivity variation with a single atomic layer of graphene. The conductivity variation was patterned as disks with a radius of 50 nm on a square lattice, as shown in the insets of FIGS. 5A and 5B. Each trace in FIG. 5A represents a different lattice pitch, from 160 nm to 220 nm in increments of 20 nm. Each trace in FIG. 5B represents a different graphene Fermi level, from 0.4 eV to 0.8 eV.

FIGS. 5A and 5B show that this graphene metamaterial exhibits spectrally tunable enhanced optical absorption. The geometry and dimensions of the periodic doping pattern can be optimized to achieve coherent perfect absorption. The resonant wavelength of the graphene plasmonic modes can vary across a large wavelength range when graphene's Fermi level is tuned by changing the lattice pitch, as shown in FIG. 5A, and tuned dynamically by applying an electric voltage to the gates. For example, FIG. 5B shows a wavelength blueshift of more than 2 μm as the Fermi level of graphene is increased from 0.4 eV to 0.8 eV. Even larger dynamic wavelength tunability may be achieved with higher Fermi level tunability with nanoscale electrolyte gates (e.g., >1 eV). This type of voltage-tunable optical absorption directly benefits the hyperspectral imagers, biochemical sensors, and other devices.

Fabrication of Optical Conductivity Spatial Modulation Devices

Figure 6B:
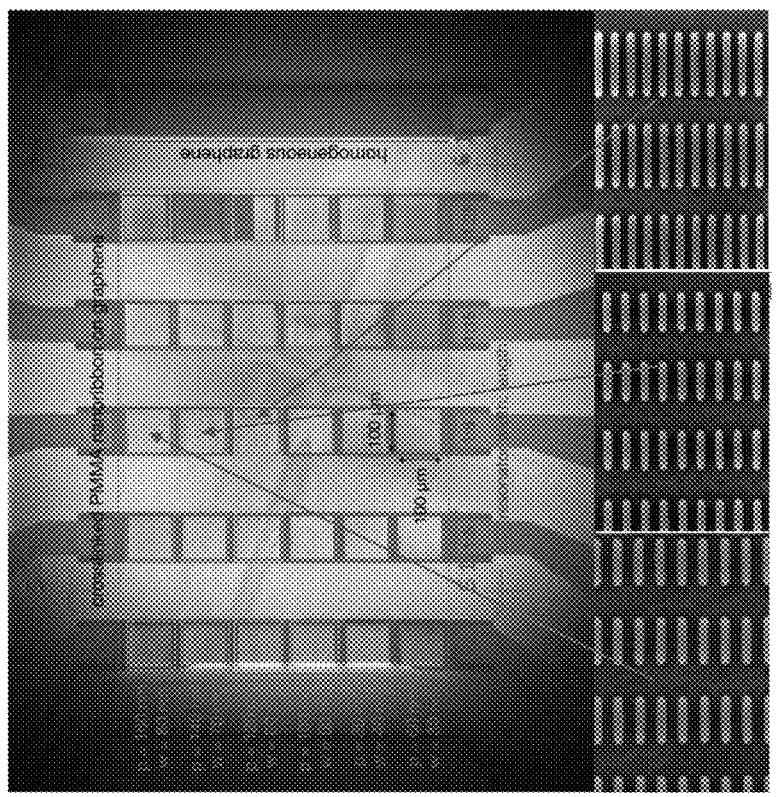
FIG. 6B shows a scanning electron micrograph (SEM) of devices like those in FIG. 6A with cross-linked PMMA masks prior to electrolyte deposition.
Figure 6A:
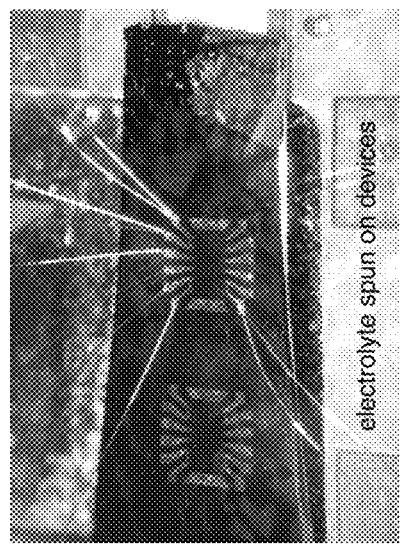
FIG. 6A shows an optical microscope image of an optical conductivity modulation devices enabled by nanopatterning electrolyte gates.

FIGS. 6A-6D illustrate optical conductivity spatial modulation devices with high carrier mobility and spatially varying optical conductivity as well as measurements of those devices. FIG. 6A is an optical microscope image of a device like the one shown in FIG. 2 (without hBN encapsulation) with a PMMA mask on the graphene and a spin-coated electrolyte layer on the graphene and PMMA mask as in FIG. 3A. FIG. 6B shows SEM images of different devices with cross-linked PMMA masks prior to electrolyte deposition. The insets at bottom show close-ups of some of the devices. The devices shown in FIGS. 6A and 6B were made on CVD graphene transferred on a $SiO_2$ substrate. Nanoribbon-shaped spatial modulation of optical conductivity is enabled by the nanopatterned electrolyte gates with various dimensions (widths of 30 nm to 80 nm as shown in FIG. 6B). These devices had plasmonic resonances in the 4-10 μm range, according to finite difference time domain (FDTD) simulations.

Figure 6C:
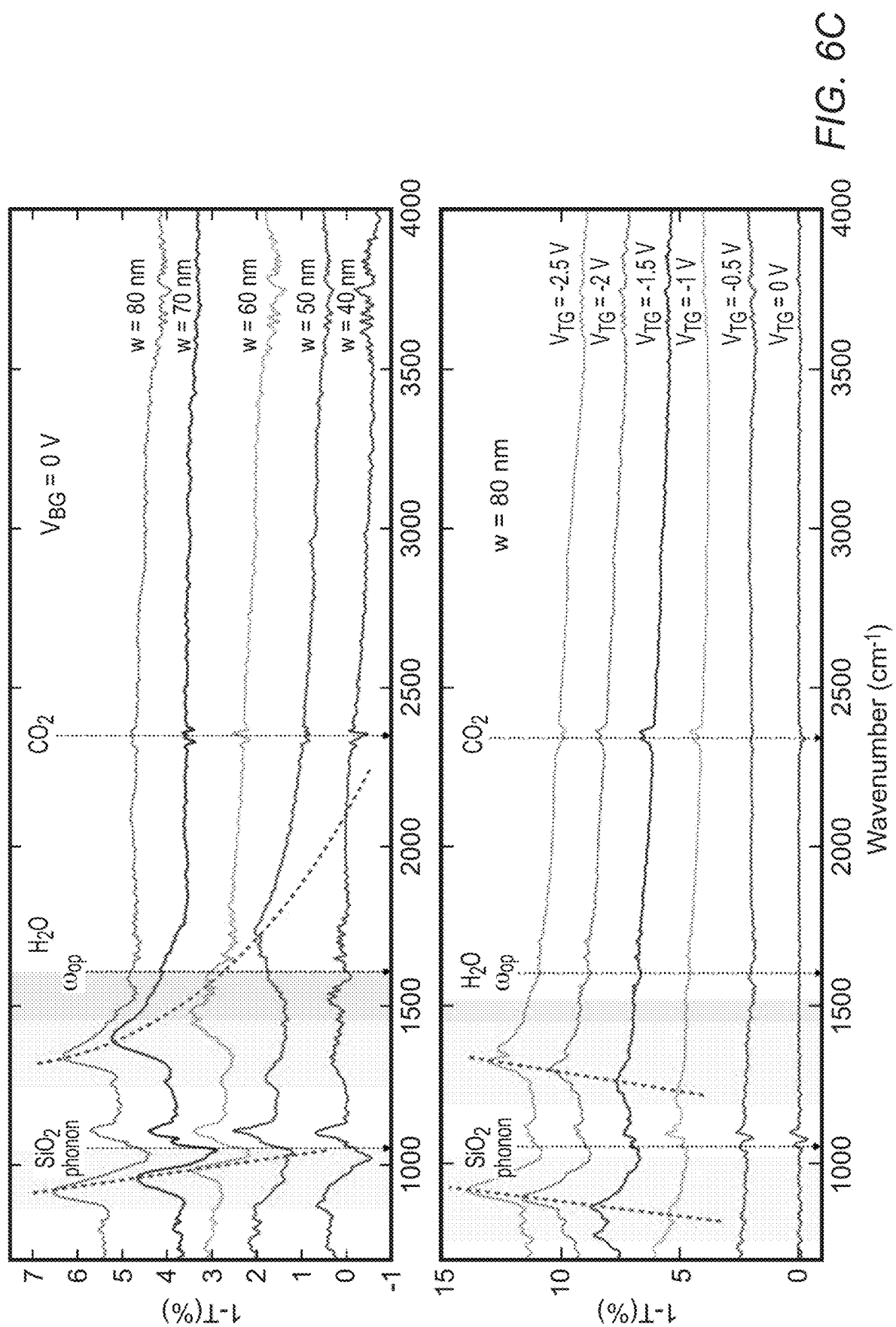
FIG. 6C shows Fourier-transform infrared (FTIR) transmission spectra of reference devices with etched graphene nanostructures with different dimensions and different graphene Fermi levels (gate voltages).
Figure 6D:
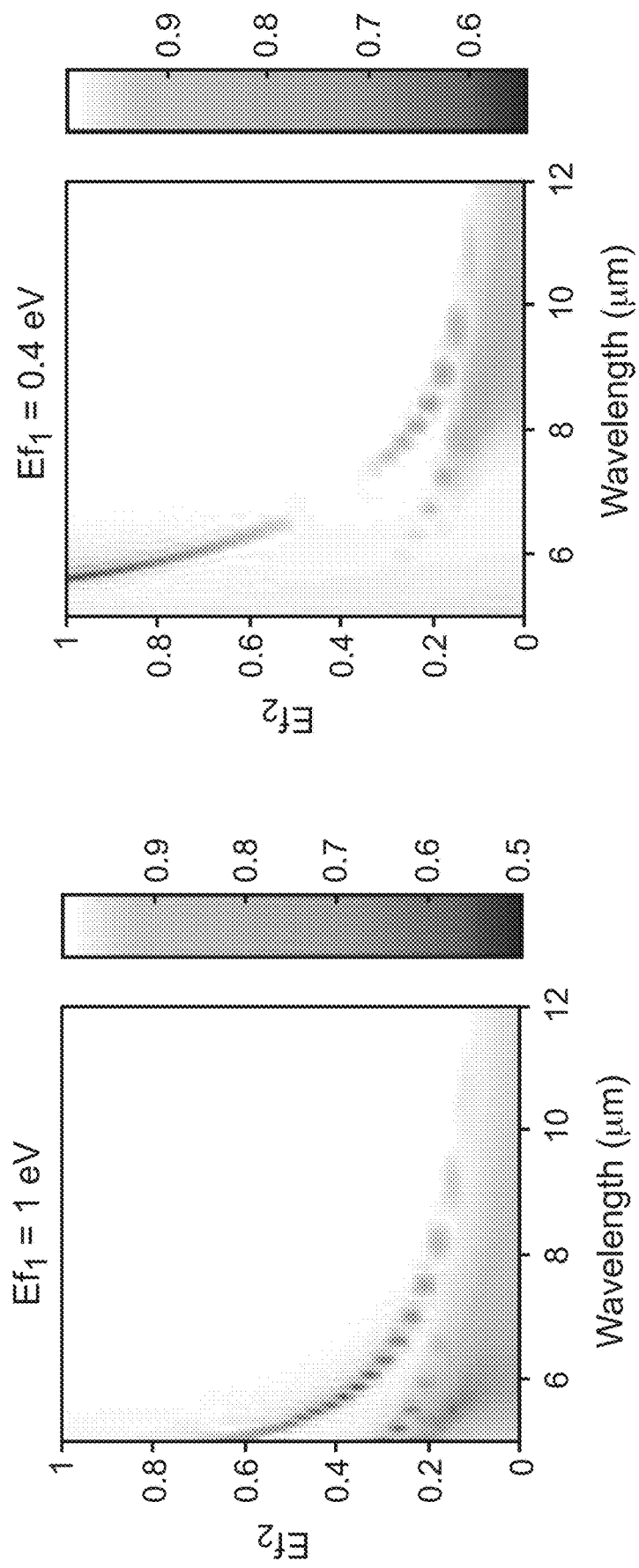
FIG. 6D shows finite-difference time-domain (FDTD) simulated transmission spectra of optical conductivity modulation devices. Each 2D plot assumes constant graphene Fermi level on one side of the junction and varies graphene Fermi level on the other side of the junction.

FIG. 6C shows FTIR transmission spectra of reference devices with etched graphene nanostructures with different dimensions and different graphene Fermi levels (gate voltages). The upper plot shows spectra with a constant back gate voltage $V_{BG}=0$ V and different ribbon widths, and the lower plot shows spectra with different $V_{BG}$ and a ribbon width of 80 nm. And FIG. 6D shows transmission spectra, simulated with FDTD, of a graphene periodic optical conductivity modulation device. The left plot in FIG. 6D shows the transmission spectrum for a Fermi level of 1 eV on one side of the periodic junction a variable Fermi level on the other side of the junction. And the right plot in FIG. 6D shows the transmission spectrum for a Fermi level of 0.4 eV on one side of the periodic junction a variable Fermi level on the other side of the junction.

Reducing Edge Scattering Loss with Well-Defined Graphene Edges

If the graphene nanostructures have poorly defined edges, these edges can cause roughness-related scattering loss. To produce sharper edges with lower scattering loss, the graphene nanostructures can first be defined on copper foils by a standard e-beam lithography and reactive-ion-etch process. The edge roughness is then reduced by another CVD step that transforms the poorly-defined edges into well-defined armchair or zigzag edges. This approach, as an alternative to the optical conductivity modulation approach disclosed above with the electrolyte nanopatterning technique, allows a simpler geometry where the optical disruption of the electrolyte and the resist mask above the graphene plasmonic metamaterials can be eliminated.

Tunable Flat Optics with Graphene Metamaterials for Beam Steering and Focusing

Conventional optical components, such as lenses, directional couplers, and phase shifters, rely on light propagation over a distance much larger than a wavelength to produce the desired changes in phase, amplitude, or polarization. This typically results in a large device footprint that limits the dimensions of nanoscale photonic networks. Metamaterials have been proposed as an alternative to this approach, where abrupt phase changes over the scale of the wavelength are introduced on an interface by optical scatterers to shape the wave fronts of the incident light (hence "flat optics").

Figures 7A, 7B:
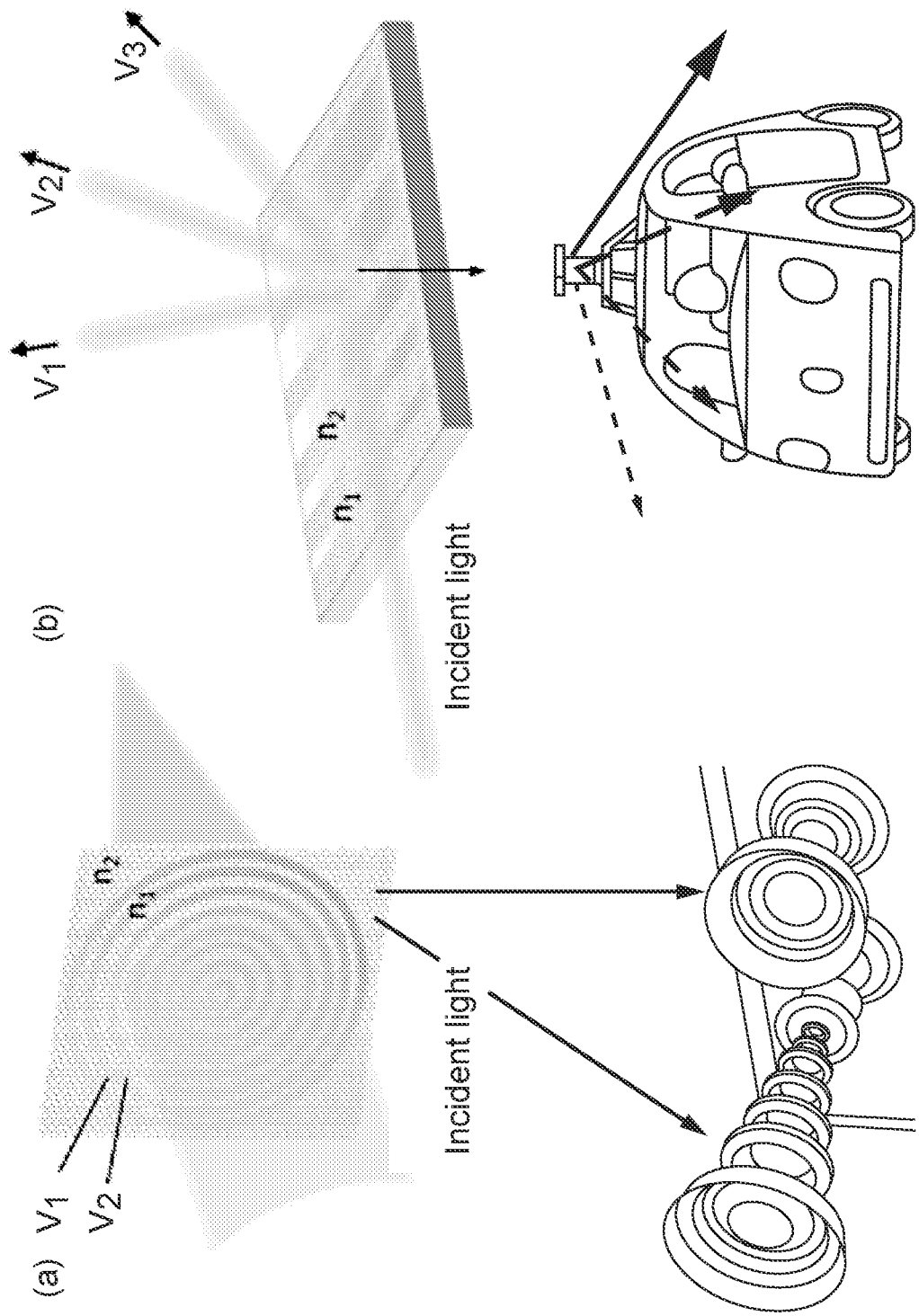
FIG. 7A shows a flat, tunable graphene lens suitable for use in a smartphone camera.
FIG. 7B shows a flat, tunable graphene beam-steering device suitable for use in a lidar for a self-driving car.

FIGS. 7A and 7B show flat optics using the graphene metamaterials disclosed herein for focusing and steering light without any moving parts. FIG. 7A shows a tunable flat lens made of graphene material (top) whose focus can be changed by changing the applied voltage. This type of lens could replace conventional optical zoom lenses like the mobile phone cameras shown at the bottom of FIG. 7A. The replacement lens could be much thinner and would not need any moving parts.

FIG. 7B shows a graphene metamaterial beam-steering device (top) that could replace a scanning galvanometer in a laser radar (LIDAR) system, e.g., in a self-driving car (bottom) or another autonomous vehicle. Changing the Fermi level of the graphene with an applied voltage changes the direction of the graphene metamaterial beam-steering device's output. This device steers the beam in one dimension (e.g., in a plane roughly parallel to the ground), but other devices may steer beams in two dimensions.

The propagation of light before and after such a metamaterial surface is described by the generalized laws of refraction and reflection, which is a direct result of Fermat's principle of least time:

$$n_t \sin(\theta_t) - n_i \sin(\theta_i) = \frac{1}{k_0} \frac{d\phi}{dx};$$

$$\cos(\theta_t)\sin(\varphi_t) = \frac{1}{n_i k_0} \frac{d\phi}{dy} \text{ (Generalized law of refraction)}$$

$$\sin(\theta_r) - \sin(\theta_i) = \frac{1}{n_i k_0} \frac{d\phi}{dx};$$

$$\cos(\theta_r)\sin(\varphi_r) = \frac{1}{n_i k_0} \frac{d\phi}{dy} \text{ (Generalized law of reflection)}$$

where $\theta_i$, $\theta_r$, $\theta_t$, $\phi_r$, $\phi_t$ are incident, reflected and transmitted light angles, $n_i$ and $n_t$ are refractive indices of the media on the two sides of the interface, $k_0$ is the magnitude of the free-space wavevector. $d\varphi/dx$ and $d\varphi/dy$ denote the phase change imparted on the incident light by the metasurface.

Many metasurfaces include optical scatterers, such as arrays of optical metal antennas or other resonators. However, metal-based metasurfaces may be constrained by their inherent plasmonic frequency, so their working wavelength is limited, and they are passive devices that cannot be dynamically controlled. Metamaterials based on graphene (including those disclosed here), on the other hand, enable full dynamic tunability across a large wavelength range thanks to their large variation of optical conductivity by electrical gating, opening up numerous new possibilities for active dynamic photonic devices for a broad range of wavelengths from visible to terahertz.

Although simulations have shown the potential of tunable metasurface designs based on graphene nanoribbons for beam bending, steering, and focusing in the mid-infrared and terahertz ranges, no experimental results have been demonstrated yet. This is due to the same reasons that other demonstrations of graphene plasmons have not reached their potential performance: it is not straightforward to gate patterned nanostructures that are electrically disconnected, and the quality of graphene plasmons is largely reduced when graphene is patterned into nanostructures.

To this end, nanoscale electrolyte doping of graphene as shown in FIG. 3A and described above can be used to produce graphene metamaterials for flat optics. These graphene metamaterials may be periodically or aperiodically doped in ribbon, cut-wire, or nanoantenna geometries. Other approaches including in-plane graphene/hBN heterostructure with nanoresonator patterns and graphene nanoresonators coupled with metal nanoantennas can be used to produce voltage-tunable metamaterials as well. They can be used to steer and bend light possibly due at least in part to their improved graphene plasmon quality factor.

FIGS. 8A-8L show several geometries for a unit cell in a reconfigurable graphene metasurface device. FIG. 8M shows how these unit cells can be fabricated in a CMOS process. Each unit cell in the device can be considered an optical resonant subwavelength antenna that can interact with and scatter incident light waves with certain amplitude and phase.

Figure 9A:
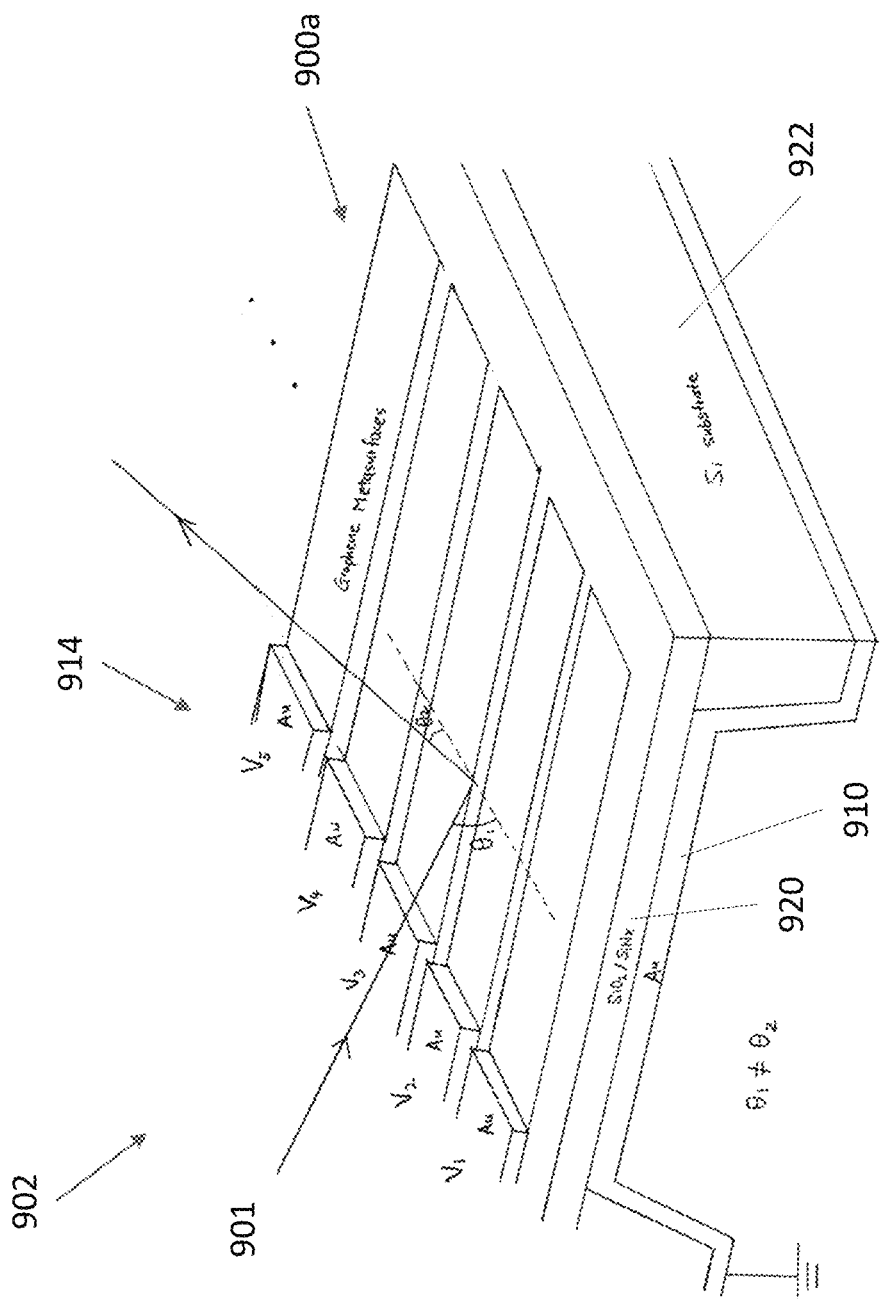
FIG. 9A shows a tunable beam-steering device with a one-dimensional array of graphene metamaterial unit cells.
Figure 9B:
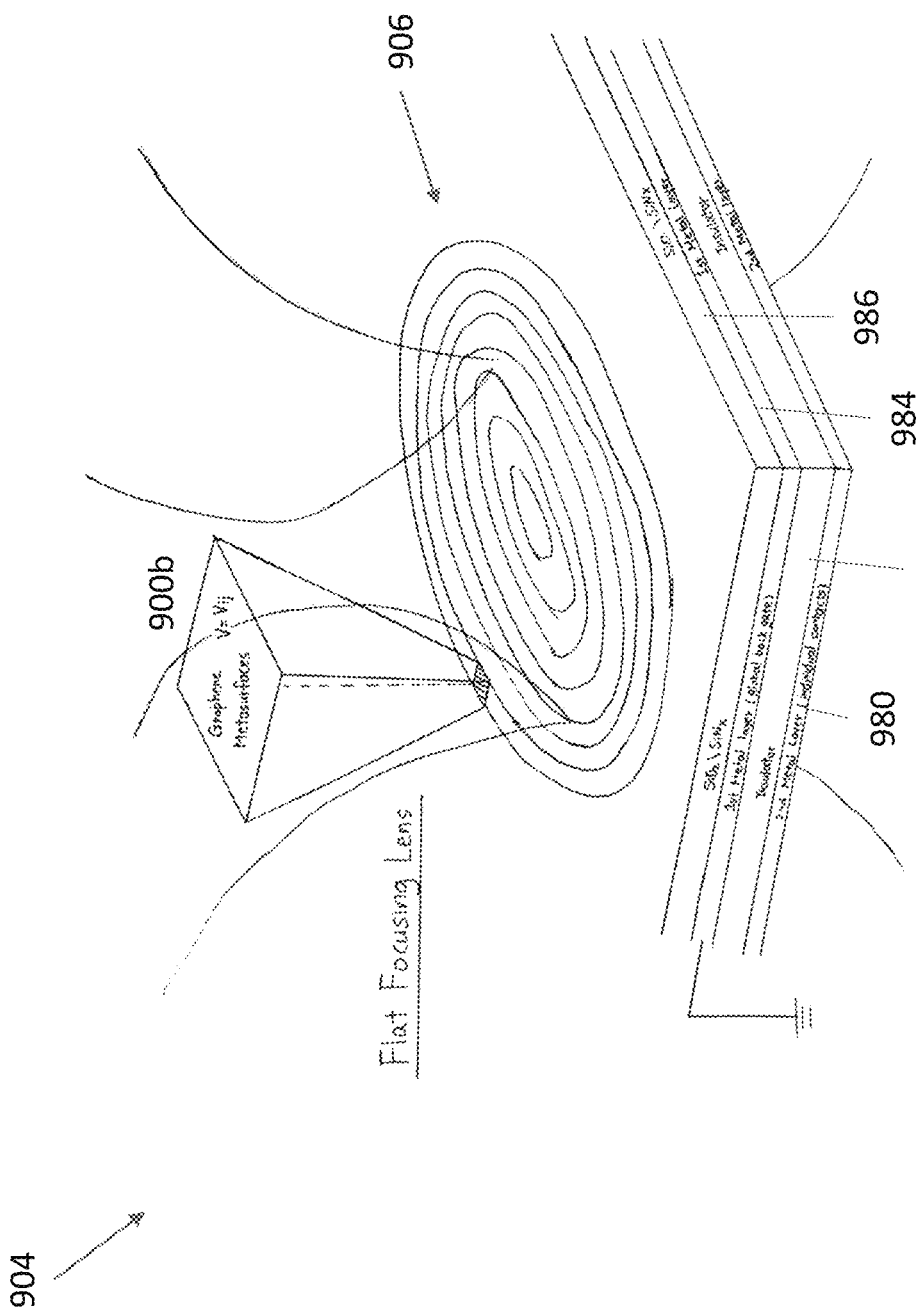
FIG. 9B shows a tunable lens with graphene metamaterial unit cells arranged in a two-dimensional pattern.

The unit cells can be combined in various ways to generate far-field radiation patterns produced by the interference of the individual radiation patterns of the unit cells and can be calculated via the antenna array theory. For example, each of these unit cells can be arranged in a one-dimensional periodic array (e.g., as in FIG. 2), a two-dimensional array, or any other suitable pattern. Two applications, a beam-steering device and a planar focusing lens, are shown in FIGS. 9A and 9B, respectively.

Figure 8D:
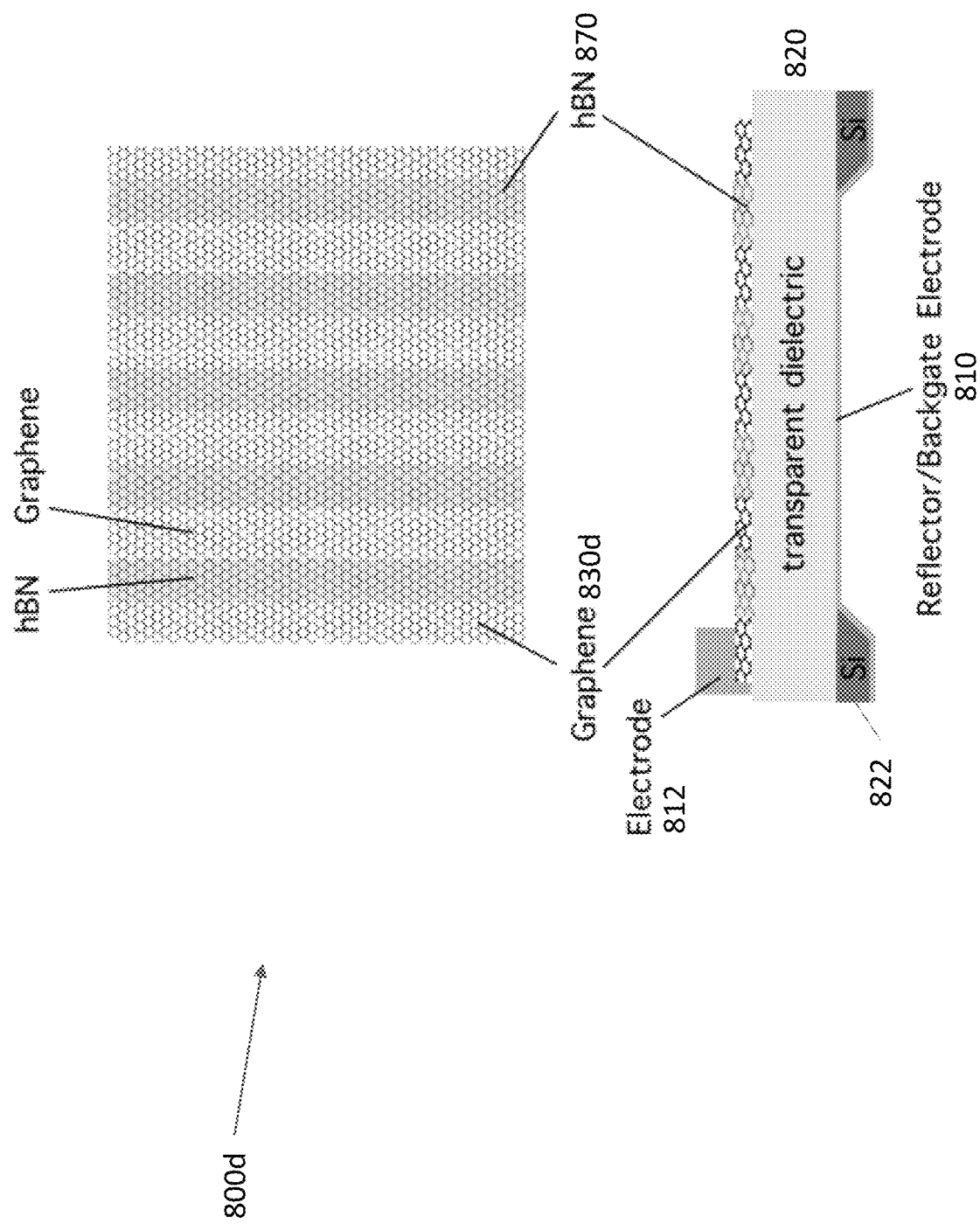

FIG. 8A shows a unit cell 800a with graphene nanoribbons 830a on one side of a silicon nitride substrate 820 that is about 1 µm thick and is supported by a silicon substrate 822. These graphene nanoribbons 830a (and the graphene in each of the other unit cells shown in FIGS. 8A-8L) may be grown or transferred on a monolayer or multi-layer of hBN 824 and, optionally, encapsulated with one or more additional layers of hBN as shown in FIG. 2. The other side of the substrate 820 is coated with a thin layer of gold 810. This gold layer 810 serves as both a reflector that reflects light incident on the graphene side of the unit cell 800a and a back-gate electrode. The unit cell 800a (and each of the other unit cells shown in FIGS. 8A-8L) may include one or more other electrodes (not shown) on the graphene side of the unit cell 800a. Applying a voltage across the graphene layer 830a with these electrodes modulates the unit cell's reflectivity as explained in greater detail below.

FIG. 8B shows a unit cell 800b with a uniform layer of graphene 830b on the HBN layer 824 one side of the substrate 820 and a PMMA mask 850b on the graphene 830b. An electrolyte 840b covers the PMMA mask 850b and the portions of the graphene 830b exposed through the PMMA mask 850b. (The other unit cells in FIGS. 8A-8L can also be modified to include electrolyte layers and suitably patterned PMMA masks.) In this case, the PMMA mask 850b is patterned into a one-dimensional array of nanoribbons, creating a corresponding one-dimensional spatial variation in the optical conductivity of the graphene as explained above with respect to FIGS. 3A-3D. The spatial variation in the conductivity can be changed by applying a voltage across the unit cell 800b with the back electrode 810 and other electrodes like those shown in FIG. 3A.

FIG. 8C shows a unit cell 800c with a uniform graphene layer 830c on the HBN layer 824 and coated with gold nanoribbons 860c. These nanoribbons 860c are arranged in a periodic one-dimensional array and modulate the optical conductivity of the unit cell 800c. Other nanoribbon arrangements are also possible; for example, the nanoribbons could form an array that is linearly chirped in nanoribbon width, pitch, or both to produce a voltage-tunable prismatic effect. The nanoribbons could also be arranged in a quadratically chirped array to form a cylindrical Fresnel lens with a voltage-tunable focus in one dimension.

FIG. 8D shows a unit cell 800d with an in-plane graphene/hBN heterostructure on the substrate 820. The in-plane graphene/hBN heterostructure comprises alternating ribbons or strips of graphene 830d and hBN 870. To produce sharper edges with lower scattering loss, the graphene nanostructures can first be defined on copper foils by an e-beam lithography and reactive-ion-etch process. The edge roughness is then reduced by another CVD step that transforms the poorly-defined edges into well-defined armchair or zigzag edges. A layer of hBN is then grown to fill the gap between the graphene nanostructures. The carrier concentration in graphene can be modulated by applying a voltage across the back-gate electrode 810 on one side of the substrate 820 and another electrode 812 on the other side of the substrate 820.

FIGS. 8E-8I show examples of graphene nanostructures coupled to metallic plasmonic nanoantennas. The metallic nanoantennas facilitate the excitation of graphene plasmons and enhance the localized field surrounding the graphene plasmonic nanostructures.

FIG. 8E shows a unit cell 800e with a metallic plasmonic metasurface (here, gold nanoribbons 830e) with graphene 860e as an active load. The graphene 860e is patterned into strips or nanoribbons that are interleaved with the gold nanoribbons 830e.

FIG. 8F shows a unit cell 800f with square graphene nano-patches 830f coupled to rectangular metallic plasmonic antennas 860f made of gold.

FIG. 8G shows a unit cell 800g with a graphene "fishnet" 830 that defines exposed squares of substrate 810 on a square lattice. The unit cell 800g includes rectangular gold plasmonic antennas 860g arranged diagonally on each exposed substrate square.

FIG. 8H shows a unit cell 800h with a graphene nanodisk 830h at the center of a gold bull's eye nanoantenna 860h.

FIG. 8I shows a unit cell 800i with a graphene nanodisk 830i coupled to gold Archimedean spiral antennas 860i that terminate at the graphene nanodisk 830i.

Figure 8L:
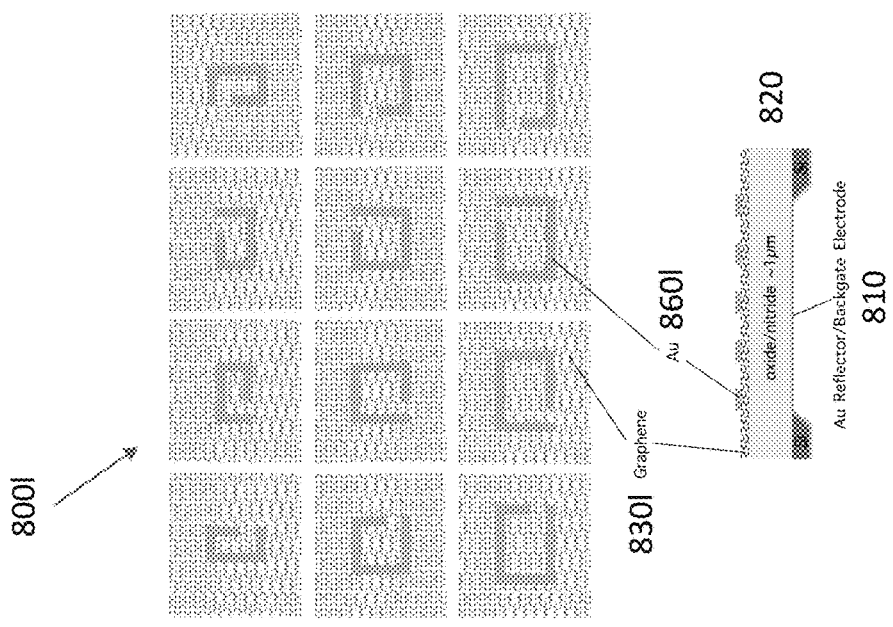
Figure 8K:
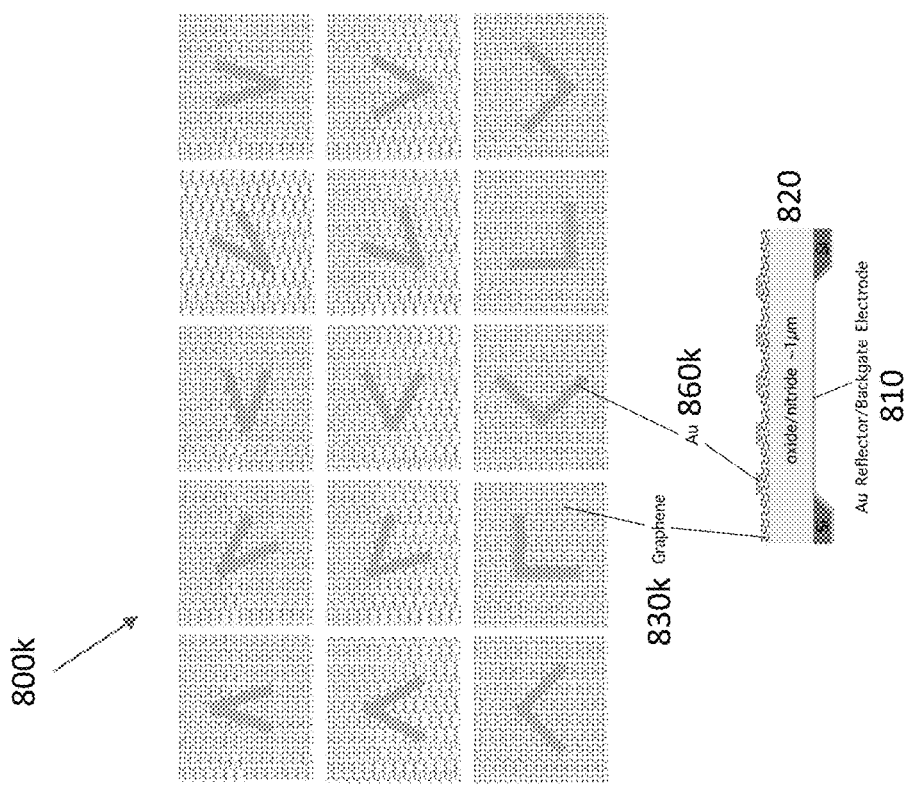
Figure 8M:
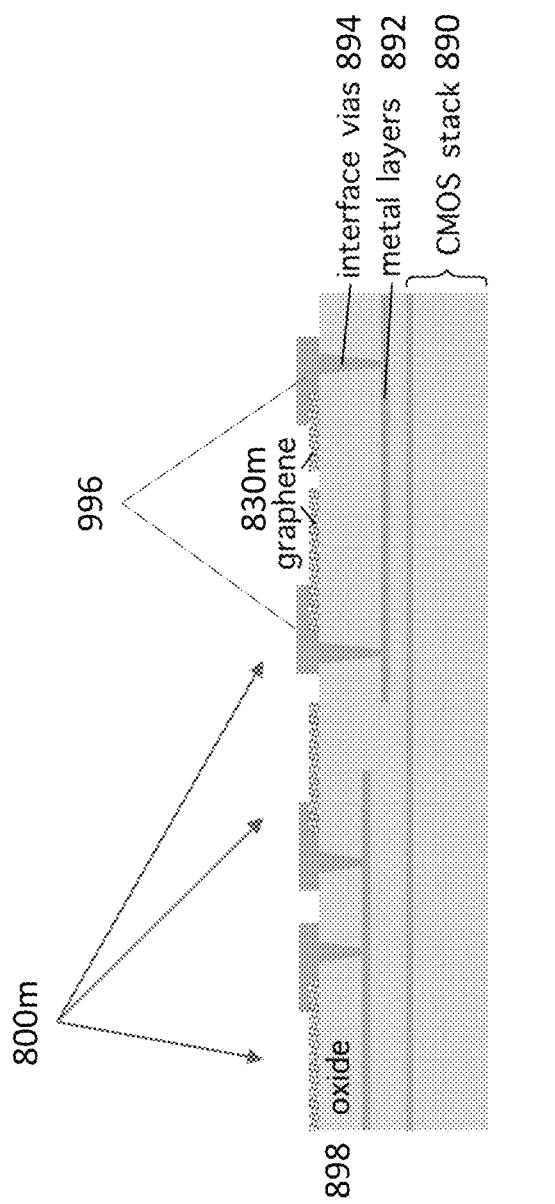
FIG. 8M shows graphene unit cells in a CMOS stack

FIGS. 8J-8L show examples of metallic plasmonic structures whose optical response can be dynamically tuned by changing the Fermi level of the graphene underneath these structures.

FIG. 8J shows unit cells 800j with metallic triangular plasmonic metasurfaces 860j with graphene squares 830j as active loads. Each metallic triangular plasmonic metasurface 860j includes an isosceles triangle with a different apex angle and orientation. The triangles on the top row have the largest apex angles, the triangles in the left column point up, and the triangles in the right column point down. These unit cells 800j can be arranged to generate a desired phase pattern for a specific application, such as a zoomable lens or beam-steering device.

FIG. 8K shows unit cells 800k with metallic Vee-shaped plasmonic metasurfaces 860k with graphene squares 830k as active loads. The metallic Vee-shaped plasmonic metasurfaces 860k includes Vees with different apex angles and orientations. The Vees on the top row have the smallest apex angles, the Vees in the left column point up, and the Vees in the right column point down. These unit cells 800k can be arranged to generate a desired phase pattern for a specific application, such as a zoomable lens or beam-steering device.

FIG. 8L shows a unit cell 800l with metallic unconnected rectangular loop plasmonic metasurfaces 860l with graphene squares 830l as an active load. The unconnected metallic rectangular loop plasmonic metasurfaces 860*l* includes unconnected or broken rectangles with different aspect ratios, "break" or disconnection locations, and lateral dimensions. These unit cells 800*l* can be arranged to generate a desired phase pattern for a specific application, such as a zoomable lens or beam-steering device.

FIG. 8M illustrates unit cells 800*m* made within a CMOS platform. The graphene 830*m* in the unit cells 800*m* is formed on top of an oxide layer 898, which is in turn on a CMOS stack 890. To facilitate compact packaging of phase-changing metamaterial unit cells, the graphene 830*m* in each unit cell 800*m* is electrically connected to metal pads (electrodes) 896 through vertical contacts (interface vias) 894. The vertical contacts 894 connect to separate metal layers 892 in the CMOS stack 890. Each unit cell 800*m* is controlled by a global, uniform oxide gate (e.g., metal layer 893 in the CMOS stack), and a different contact voltage, enabling locally varying gate voltages.

FIG. 9A shows a one-dimensional beam-steering device 902 with an array of unit cells 900*n* on the same substrate 920. The unit cells 900*a* are controlled by a common back gate electrode 920 and individual electrodes 914. Electrodes 914 apply potentials $V_1$ through $V_5$ to the unit cells 900*a*. These potentials can be the same or different (e.g., linearly ramped) and control the amplitude and phase of an incident beam of light 901. By controlling the amplitude and phase of the reflected or transmitted light, a number of applications including beam steering, beam focusing, perfect absorption, perfect reflection, polarization control, super-resolution lens, and "cloaking" can be achieved. In this case, the applied voltages form a voltage gradient that causes the beam of light 901 to reflect at angle that is less than the angle of incidence. Changing the voltages changes the angle of reflection, steering the beam of light 901, and may also change the reflectivity at certain wavelengths.

FIG. 9B shows a voltage-tunable planar focusing lens 904. The lens 904 includes graphene metasurface unit cells 900*b* arranged in rings 906 that form a Fresnel lens pattern. The unit cells 900*b* are on a multi-layer CMOS stack with a silicon nitride or silicon dioxide layer 986, a first metal layer 984, a dielectric layer 982, and a second metal layer 980. Vias (not shown) connect the electrodes in the unit cells 900*b* to one of the metal layers for applying voltages to the unit cells 900*b*, e.g., as in FIG. 8M. Each unit cell 900*b* is controlled by a voltage $V_{ij}$ that determines the amplitude and phase of the light reflected by the unit cell 900*b*. Each phase setting causes the lens 904 to focus a particular wavelength of light at a different focal distance away. Changing the voltage (phase) configuration changes the lens's focal length.

Nanoantenna-Assisted Extreme Mode Confinement for Few-Photon Nonlinear Optics

In addition to exciting graphene plasmons with periodic nanostructures, it would also be useful to develop a way to excite plasmonic modes in a single graphene nanodisk and similar structures. The extremely large mismatch in graphene plasmon wavelength and free-space wavelength ($\lambda_{opt}/\lambda_{pl}$~300) can yield an electromagnetic field compression factor of more than $10^6$. Hence, if the conversion between free-space light and the plasmonic mode in a single graphene nanodisk is efficient, the resulting electromagnetic field intensity in the graphene nanodisk can be extremely high, which can be used to generate many optical phenomena where strong light intensity is preferred, such as nonlinear optics.

Figure 10A:
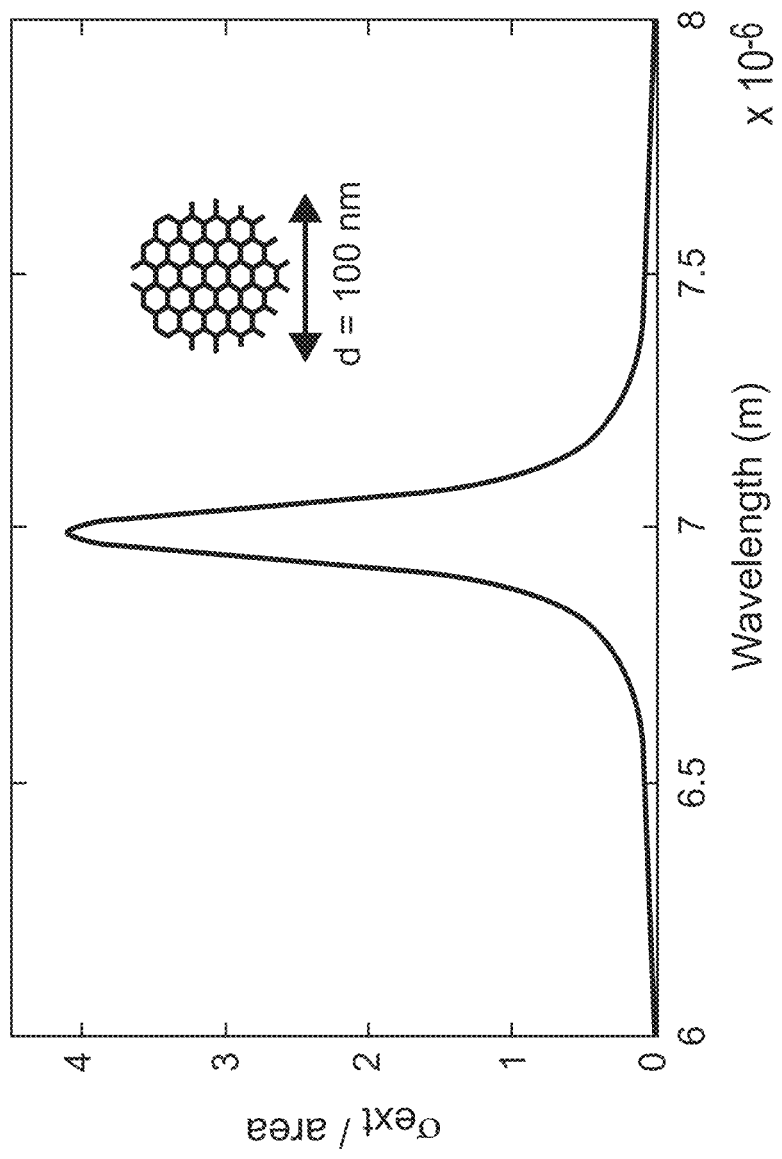
FIG. 10A shows an excitation cross section of a single graphene nanodisk when a plasmonic mode is excited.
Figures 10B, 10C:
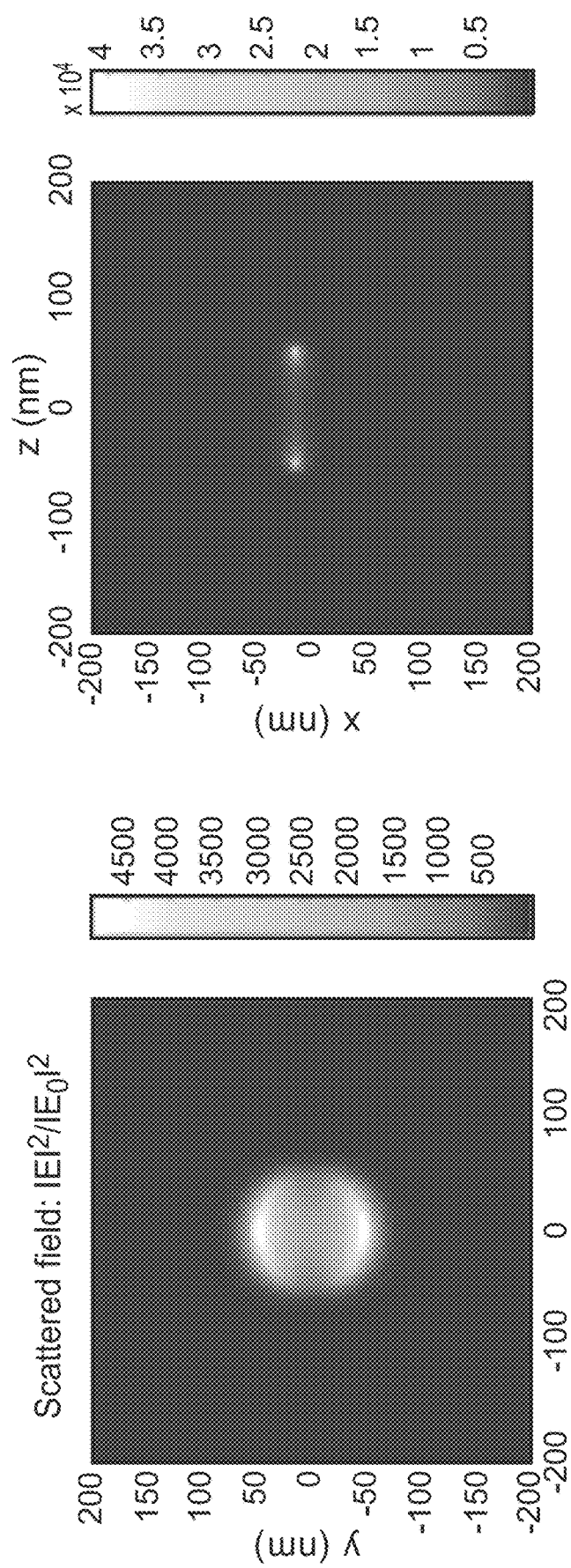
FIG. 10B is an intensity profile of an electric field in an x-y plane scattered by a graphene nanodisk when a plasmonic mode is excited at a wavelength of 7 μm.
FIG. 10C is an intensity profile of an electric field in an x-z plane scattered by a graphene nanodisk when a plasmonic mode is excited at a wavelength of 7 μm.

FIGS. 10A-10C illustrate simulations of the extreme mode confinement ability of a graphene nanodisk. These simulations were based on the boundary element method. FIG. 10A shows the excitation cross section of graphene nanodisk with a diameter of 100 nm (inset) when a plasmonic mode is excited. FIGS. 10B and 10C show the scattered electric field intensity in different planes around a 100 nm diameter graphene nanodisk corresponding to the plasmonic mode at a free space wavelength of 7 μm. From the side view of the disk, shown in FIG. 8C, the field is strongly confined to the surface of the disk and its intensity can be enhanced by as high as four orders of magnitude on the edge of the disk.

Figures 11A, 11B, 11C:
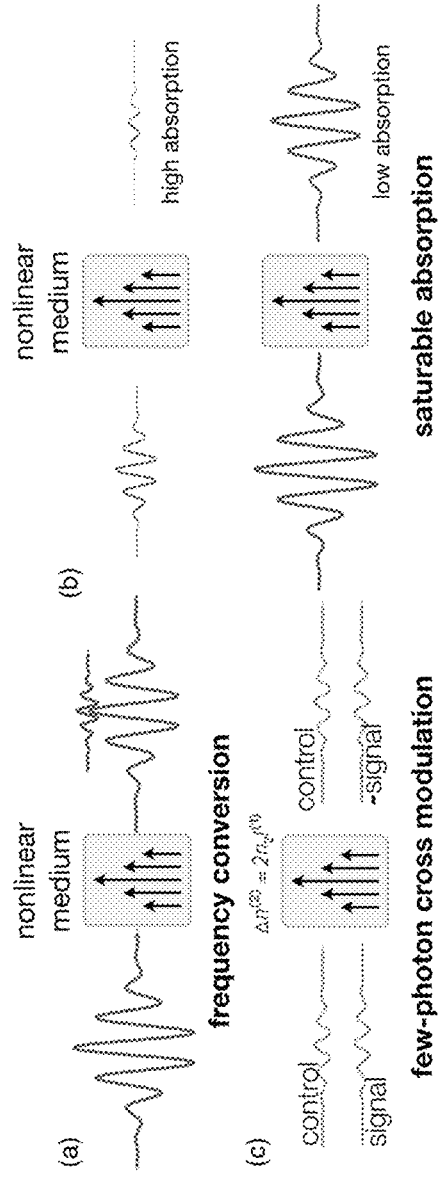
FIG. 11A illustrates nonlinear frequency conversion with an optically nonlinear graphene nanostructure.
FIG. 11B illustrates saturable absorption by an optically nonlinear graphene nanostructure.
FIG. 11C illustrates few-photon cross-modulation by an optically nonlinear graphene nanostructure.

This extreme light concentration ability, combined with graphene's high optical nonlinear coefficient, leads to low-power nonlinear optical processes that typically only occur at very high incident field powers (e.g., >>1 kW/cm$^2$), such as frequency conversion and saturable absorption, which are illustrated in FIGS. 11A and 11B, respectively. Furthermore, this also allows for nonlinear optical processes at even single-photon or few-photon level, as shown in FIG. 11C, which is useful in optical routing and optical computing at the quantum level.

One nonlinear optical phenomenon at few-photon level is the plasmon blockade effect, where the excitation of one plasmon quantum in a graphene nanodisk prevents further excitation of plasmons in the same disk. This is a manifestation of strong optical nonlinearities in graphene where a single photon has the ability to interact with another single photon. Theory has predicted that when a single quantized plasmon is excited by a laser beam with power as low as 7 mW, the electric field amplitude associated with it can be around $10^7$ V/m, which is of the same order of magnitude as the intrinsic field $E_e$ in graphene. At this field strength, an external field can no longer drive a self-sustained charge density oscillation, leading to a much higher damping rate for multi-plasmon excitations. Hence the excitation of the first plasmon would "block" the excitation of the following plasmons, demonstrating strong plasmon-plasmon interaction.

Simulation backs up this theoretical calculation. A mid-infrared plane wave excitation of 7 mW for a laser focused to a 10 μm radius spot corresponds to an incident field amplitude of about $10^5$ V/m. With a 100 times enhancement in field amplitude, this results in a $10^7$ V/m electric field, which is the same as predicted by theoretical calculations.

Despite the phenomena associated with an excited plasmonic mode in a graphene nanodisk, efficient coupling from free space light into the nanodisk can be challenging because of wave-vector mismatch between plasmons and free-space light. Various approaches have been proposed to increase the coupling efficiency, including scanning type near-field optical microscope (s-SNOM), surface acoustic wave mediation, dielectric gratings, and difference frequency generation. However, drawbacks are still present for each of these approaches. For example, s-SNOM does not allow far-field excitation and has unknown excitation efficiency; dielectric gratings require a large coupling length for efficient excitation, which in turn requires a large plasmon propagation length that is hard to achieve (on the order of the free-space wavelength). Hence, the coupling efficiency between plasmons and photons has as of yet been extremely low.

Figure 12A:
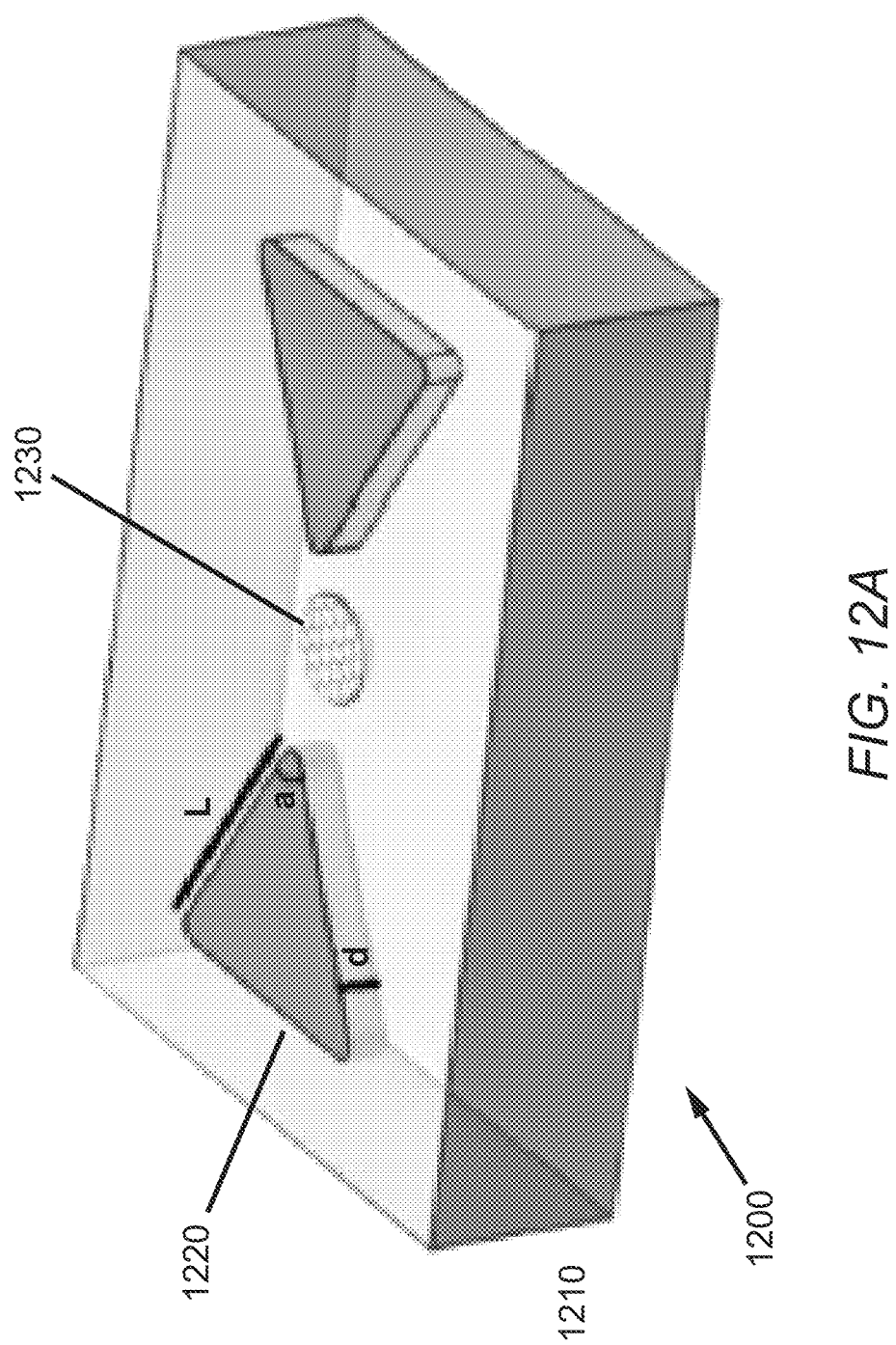
FIG. 12A shows a bowtie graphene nanoantenna with a triangular metal plasmonic nanoantenna that induces a plasmonic mode and concentrates a strong electromagnetic field in a graphene nanodisk.
Figure 12B:
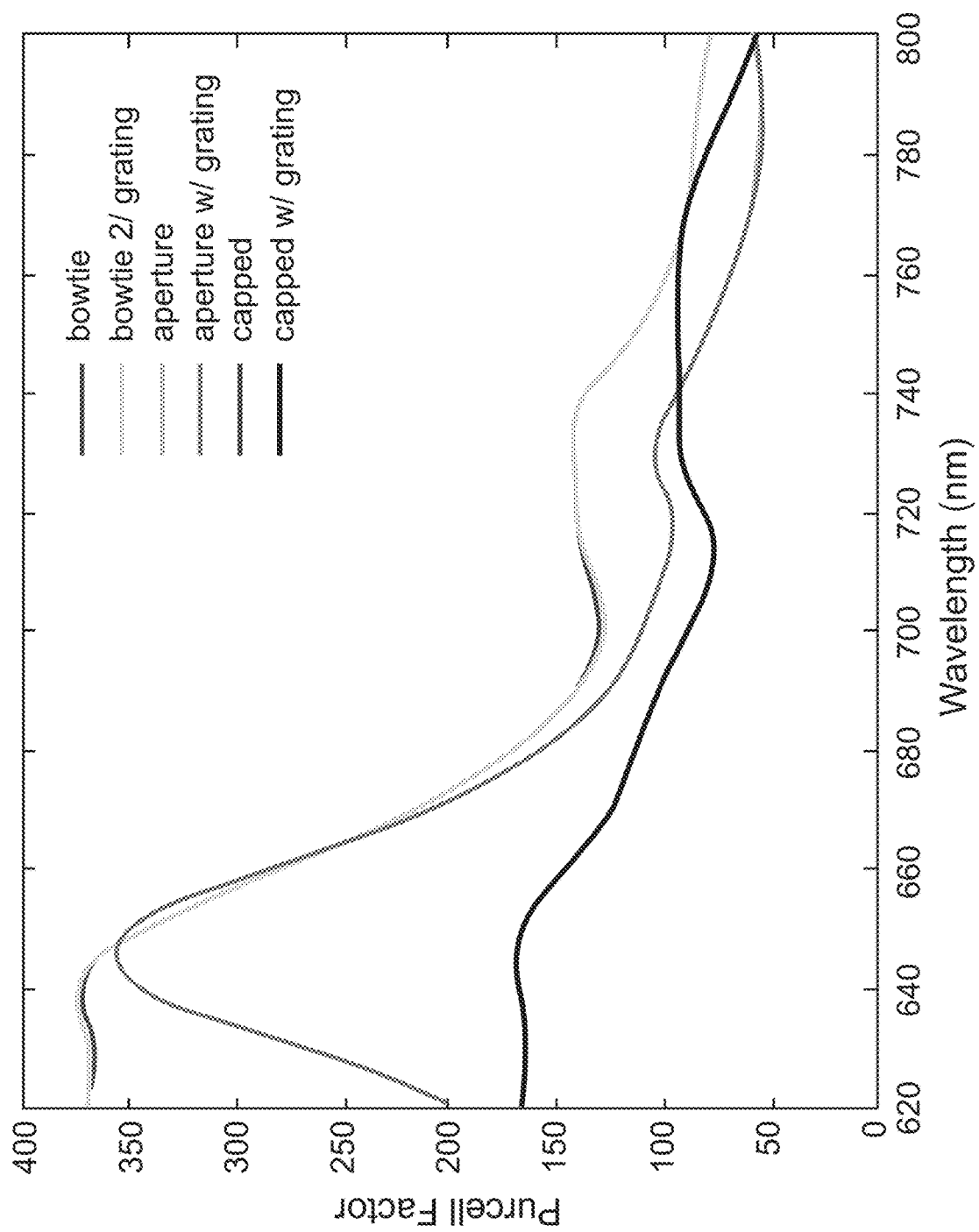
FIG. 12B is a plot of the Purcell enhancement factor versus wavelength for different bowtie nanoantennas (one example shown in FIG. 12A).

FIGS. 12A and 12B illustrate a plasmonic nanoantenna device 1200 that addresses the challenges associated with coupling light from free space into a graphene nanodisk. FIG. 12A shows the device 1200, which includes a graphene nanodisk 1230 with a diameter of 100 nm at the center of a bowtie-shaped metal nanoantenna 1220. A dielectric substrate 1210 supports the graphene nanodisk 1230 and the bowtie-shaped metal nanoantenna 1220. An incident single photon is coupled into the graphene nanodisk 1230 through the metal plasmonic nanoantenna 1220, inducing plasmonic mode and concentrating strong electromagnetic field in the graphene nanodisk. FIG. 12B shows the Purcell enhancement factor for the device 1200 in FIG. 12A (top trace) and for several other nanoantenna designs, which have large bandwidths (Q<10). The bow-tie design in FIG. 12A has a maximum Purcell enhancement of over 350 at a wavelength of about 640 nm, to produce near-100% light absorption from free space into the graphene disk 1230.

In addition, the nanoantennas can themselves be made of graphene. The dynamic voltage tunability of graphene's Fermi level can allow maximum overlap at all time between the bow-tie antenna's Purcell enhancement envelope and graphene nanodisk's plasmonic modes. The graphene plasmon simulation can also take advantage of the boundary element method (BEM) of simulating graphene plasmons, which has been shown to reduce the computational complexity of the typically time-consuming simulation techniques. Custom codes can be developed for graphene single nanodisk and nanodisk arrays and can be extended to more complex geometries such as graphene nanoantennas as well. These techniques provide a promising solution to the photon-plasmon coupling problem and creates an opportunity to explore and exploit the plasmon blockade phenomenon in graphene nanodisks as well as other nonlinear optical processes that typically only occur at extremely high pumping powers.

Quasi-Relativistic Doppler Effect and Non-Reciprocal Graphene Plasmons

The high-quality graphene plasmons of Technique 1 open up numerous opportunities in tunable plasmon physics that are currently not possible. One of them is the exciting possibility of observing the quasi-relativistic Doppler effect for graphene plasmons propagating along a nanoribbon.

Non-reciprocity in materials is typically induced by breaking the time-reversal symmetry with an applied magnetic field or using bulky birefringent materials. However, neither an applied magnetic field nor a bulky birefringent material is suitable for nanophotonic systems due to challenges in applying magnetic fields at the nanoscale and large device footprints, respectively. One approach to demonstrate non-reciprocity for graphene plasmonic modes is the plasmonic Doppler effect, which works as follows: injecting a DC current along or against the propagation direction of graphene plasmons alters the plasmonic dispersion relation, causing downstream (upstream) propagation to result in a blue (red) frequency shift. The plasmonic Doppler effect can be very strong in graphene and other two-dimensional electron system (2DES) due to the fact that the carrier drift velocity can reach a substantial fraction of the Fermi velocity. A direct result of this Doppler effect is the plasmonic mode splitting and selective excitation of plasmonic propagation direction with different photon energies.

This phenomenon is interesting both from a fundamental point of view and from a device application design perspective. It can be used to demonstrate non-reciprocal graphene plasmons without the magneto-optical effect or strong optical pumping and enables optical isolators that can take advantage of graphene plasmons' wide frequency range, voltage tunability, extreme field confinement and low losses.

Figure 13A:
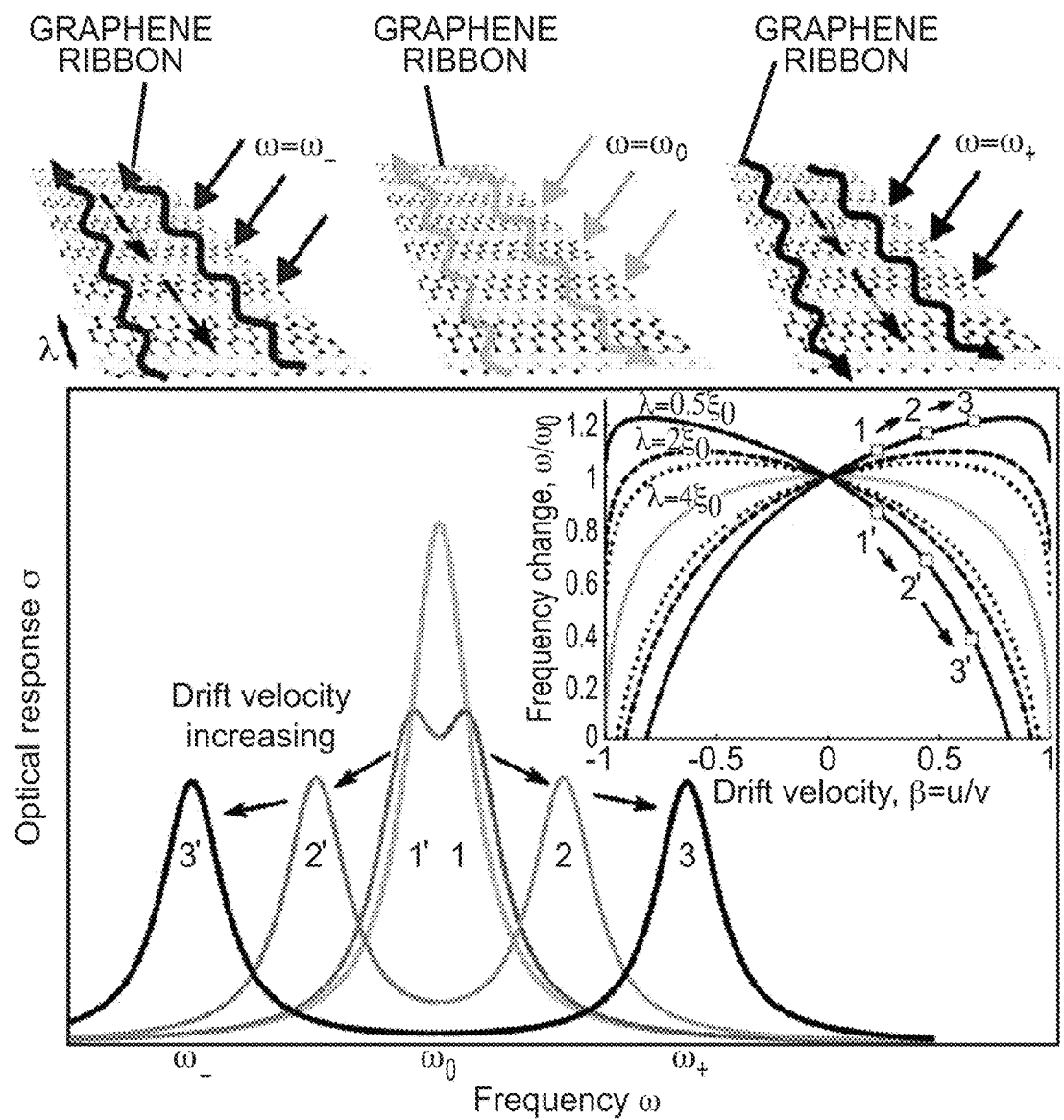
FIG. 13A illustrates splitting of a plasmon resonance in a patterned graphene ribbon due to the current-induced Doppler effect.
Figure 13B:
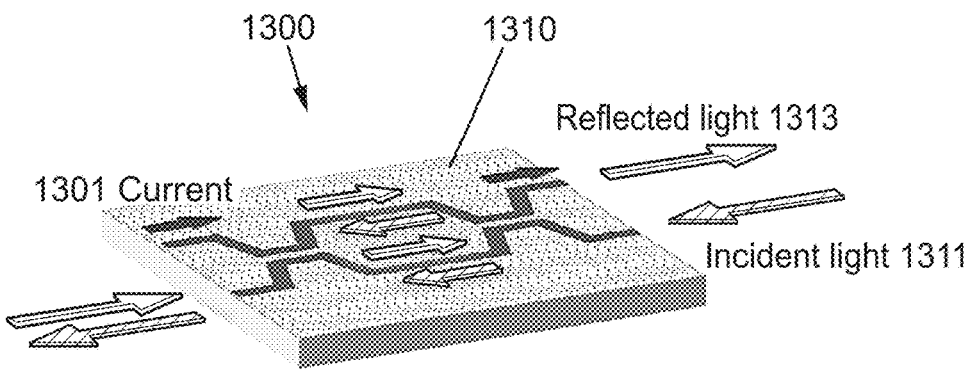
FIG. 13B shows an on-chip optical isolator based on a Mach-Zehnder interferometer and relying on the plasmonic Doppler effect.

FIGS. 13A and 13B illustrate non-reciprocity induced by plasmonic Doppler effect in the presence of a DC current. FIG. 13A is from Dan S. Borgnia, Trung V. Phan, and Leonid S. Levitov, "Quasi-Relativistic Doppler Effect and Non-Reciprocal Plasmons in Graphene," arXiv preprint arXiv: 1512.09044 (2015). It shows that a plasmon resonance in a patterned graphene ribbon (top) undergoes splitting due to the current-induced Doppler effect. Each of the two modes in the graphene ribbon can be excited individually by radiation with photons of different frequencies. Increasing drift velocity causes the resonances to split farther apart.

FIG. 13B shows an on-chip optical isolator 1300 based on a Mach-Zehnder interferometer and the plasmonic Doppler effect. The isolator 1300 includes a graphene sheet 1310 that is patterned in the form of a Mach-Zehnder interferometer using the spatial optical conductivity modulation approach or in-plane graphene/hBN heterostructure approach described above. Injecting a DC current 1301 against the propagation direction of graphene plasmons alters the plasmonic dispersion relation, causing downstream (upstream) propagation to result in a blue (red) frequency shift. In this case, the frequency shift causes the Mach-Zehnder interferometer to reflect incident light 1311, producing a counter-propagating reflected beam 1313 whose wavelength can be shifted by changing the amplitude of the DC current 1301. This provides tunable optical isolation without a magnetic field or a bulky birefringent material.

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An apparatus, comprising:
a substrate having a first side and a second side opposite the first side;
a first electrode disposed on the first side of the substrate; and
an array of unit cells, disposed on the second side of the substrate, to spatially modulate an incident beam of light, each unit cell in the array of unit cells comprising:
a layer of hexagonal boron-nitride (hBN) disposed on the substrate;
a graphene layer disposed on the layer of hBN and having a carrier mobility substantially equal to or greater than 10,000 $cm^2/(V \cdot s)$; and
a second electrode, disposed in electrical communication with the graphene layer, to apply a voltage across the graphene layer that shifts a Fermi level of the graphene layer, thereby changing an amplitude and/or phase of at least a portion of the incident beam of light.

2. The apparatus of claim 1, wherein the array of unit cells comprises:
a one-dimensional (1D) array of unit cells configured to steer the incident beam of light in an arbitrary direction.

3. The apparatus of claim 1, wherein the array of unit cells comprises:
a two-dimensional (2D) array of unit cells configured to change a divergence of the incident beam of light, a first group of unit cells in the 2D array of unit cells forming a first ring and a second group of unit cells in the 2D array of unit cells forming a second ring concentric with the first ring.

4. The apparatus of claim 1, wherein the graphene layer in at least one unit cell in the array of unit cells is patterned to form an array of graphene nanostructures.

5. The apparatus of claim 4, wherein the at least one unit cell further comprises:
an array of metal strips, each metal strip in the array of metal strips being disposed next to a corresponding graphene nanostructure in the array of graphene nanostructures.

6. The apparatus of claim 4, wherein the at least one unit cell further comprises:
an array of metal nanoantennas disposed on the graphene layer and configured to excite and couple to localized graphene plasmons.

7. The apparatus of claim 4, wherein the at least one unit cell further comprises:
hBN disposed between the graphene nanostructures in the array of graphene nanostructures.

8. The apparatus of claim 1, wherein the graphene layer comprises alternating regions of a first carrier concentration and a second carrier concentration different from the first carrier concentration.

9. The apparatus of claim 8, wherein the alternating regions have a pitch substantially equal to or greater than 15 nm.

10. The apparatus of claim 8, wherein a difference between the first carrier concentration and the second carrier concentration is substantially equal to or less than $10^{14}\,cm^{-2}$.

11. The apparatus of claim 1, wherein at least one unit cell in the array of unit cells further comprises:
another layer of hBN disposed on the graphene layer.

12. The apparatus of claim 1, wherein at least one unit cell in the array of unit cells further comprises:
a periodic array of metallic slits disposed on the graphene layer.

13. The apparatus of claim 1, wherein at least one unit cell in the array of unit cells further comprises:
- a nanoantenna comprising concentric metallic rings electrically connected to each other, and
- wherein the graphene layer comprises a graphene nanodisk disposed at a center of the nanoantenna.

14. The apparatus of claim 1, wherein at least one unit cell in the array of unit cells further comprises:
- a two-arm Archimedean spiral antenna, and
- wherein the graphene layer comprises a graphene nanodisk disposed at a center of the two-arm Archimedean spiral antenna.

15. The apparatus of claim 1, wherein the substrate is a layer in a complementary metal-oxide-semiconductor (CMOS) stack and at least a portion of the second electrode extends into the CMOS stack.

16. The apparatus of claim 15, wherein the first electrode is at least part of a metal layer in the CMOS stack.

17. An apparatus, comprising:
- a substrate;
- a graphene layer disposed on the substrate;
- an electrolyte disposed on the graphene layer;
- a pair of electrodes comprising a first electrode in electrical communication with the graphene layer and a second electrode in electrical communication with the electrolyte, to apply a bias voltage across the graphene layer and the electrolyte that causes ions in the electrolyte to migrate toward the graphene layer; and
- a patterned dielectric layer, between the graphene layer and the electrolyte, to screen the at least a portion of the graphene layer from ions in the electrolyte, thereby creating a spatially varying carrier concentration in the graphene layer, the spatially varying carrier concentration spatially modulating an optical conductivity of the graphene layer.

18. The apparatus of claim 17, wherein the graphene layer has a carrier mobility of at least about 10,000 $cm^2/(V \cdot s)$.

19. The apparatus of claim 17, wherein the patterned dielectric layer is patterned in a periodic array and the spatially varying carrier concentration varies periodically with the periodic array.

20. A method of modulating an optical conductivity of a device comprising a graphene layer, an electrolyte disposed on the graphene layer, and a patterned dielectric layer disposed between the graphene layer and the electrolyte, the method comprising:
- applying a bias voltage across the graphene layer and the electrolyte that causes ions in the electrolyte to migrate toward the graphene layer; and
- screening at least a portion of the graphene layer from ions in the electrolyte with the patterned dielectric layer, thereby creating a spatially varying carrier concentration in the graphene layer, the spatially varying carrier concentration spatially modulating an optical conductivity of the graphene layer.

* * * * *